US010673451B2

(12) United States Patent
Shafeeu et al.

(10) Patent No.: US 10,673,451 B2
(45) Date of Patent: Jun. 2, 2020

(54) CURRENT GENERATION

(71) Applicant: SOCIONEXT INC., Yokohama-shi, Kanagawa (JP)

(72) Inventors: Hassan Shafeeu, Maidenhead (GB); Vlad Cretu, Maidenhead (GB); Nicolas Rivat, Maidenhead (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 16/410,793

(22) Filed: May 13, 2019

(65) Prior Publication Data

US 2020/0076442 A1  Mar. 5, 2020

(30) Foreign Application Priority Data

Aug. 31, 2018  (EP) .................................... 18192125

(51) Int. Cl.
| | |
|---|---|
| *H03M 1/10* | (2006.01) |
| *G05F 3/26* | (2006.01) |
| *H03M 1/68* | (2006.01) |
| *H03K 5/24* | (2006.01) |
| *H03M 1/74* | (2006.01) |

(52) U.S. Cl.
CPC .......... *H03M 1/1033* (2013.01); *G05F 3/262* (2013.01); *H03K 5/24* (2013.01); *H03M 1/682* (2013.01); *H03M 1/742* (2013.01)

(58) Field of Classification Search
CPC .... H03M 1/1033; H03M 1/682; H03M 1/742; G05F 3/262; H03K 5/24
USPC .......................................... 341/118, 120, 144
See application file for complete search history.

(56) References Cited

U.S. PATENT DOCUMENTS

| | | | |
|---|---|---|---|
| 6,130,632 A | 10/2000 | Opris | |
| 6,489,905 B1 | 12/2002 | Lee et al. | |
| 7,076,384 B1 * | 7/2006 | Radulov | ............. H03M 1/1057 324/601 |
| 7,466,252 B1 | 12/2008 | Radulov et al. | |
| 7,683,813 B2 | 3/2010 | Sugai | |

(Continued)

OTHER PUBLICATIONS

European Search Report, from the European Patent Office in counterpart European Application No. 18192125.5, dated Feb. 22, 2019.

*Primary Examiner* — Khai M Nguyen
(74) *Attorney, Agent, or Firm* — Arent Fox LLP

(57) ABSTRACT

Current-generation circuitry, comprising: a plurality of candidate current sources operable to generate respective candidate currents; an output current source operable to generate an output current; comparator circuitry; and control circuitry operable to control the current sources and the comparator circuitry to: in an adjustment step, generate an adjustment current by selecting one of the candidate currents or by summing together a plurality of the candidate currents, and calibrate at least a plurality of the candidate current sources; and in a calibration step, following the adjustment step, generate a reference current by selecting one of the candidate currents generated by the candidate current sources calibrated in the adjustment step or by summing together a plurality of the candidate currents generated by those candidate current sources, and calibrate the output current source by comparing its output current to that reference current and adjusting a control signal applied to that output current source.

20 Claims, 11 Drawing Sheets

(56) References Cited

U.S. PATENT DOCUMENTS 9,035,810 B1\* 5/2015 Waltari ............... H03M 1/1038
                                                          341/120
9,046,908 B2\* 6/2015 Gong ........................ G05F 1/46

\* cited by examiner

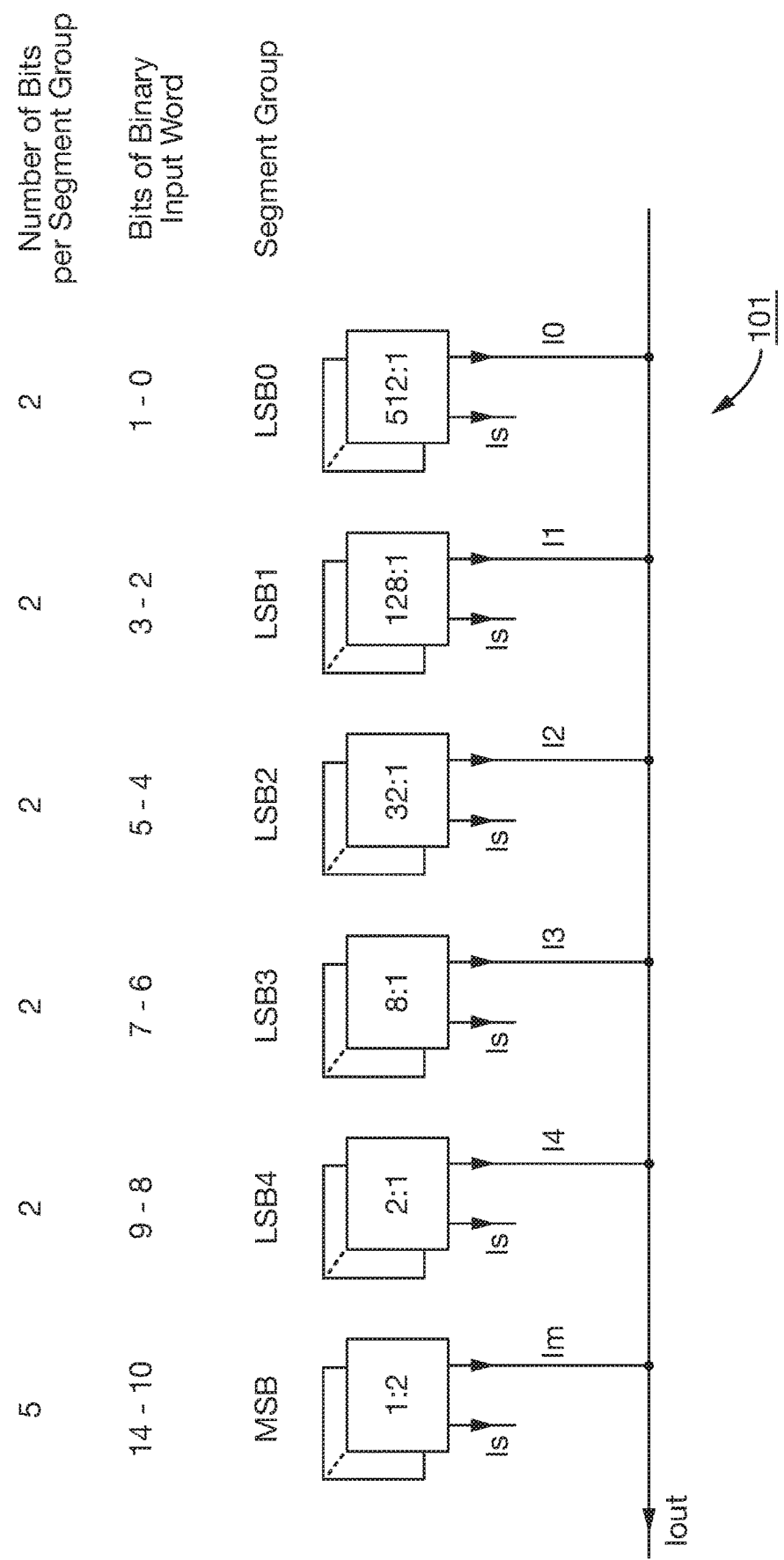

Fig. 8

| Step(s) | Time | R1 | R2 | Adjust | Maintain |
|---|---|---|---|---|---|
| X | t1.1 | CC1 | Ic | B1 | GV |
|   | t1.2 | CC2 | Ic | B2 | GV |
|   | t1.3 | CC3 | Ic | B3 | GV |
|   | t1.4 | CC4 | Ic | B4 | GV |
| Y, Z | t2 | CC1 + CC2 + CC3 + CC4 | Im | B-MSB | B1 to B4, GV |
| A, B | t3 | CC1 | I4 | B-LSB4 | B1 to B4, GV, B-MSB |
| C | t4 | CC1 + CC2 + CC3 + CC4 | I4 | GV | B1 to B4, B-MSB to B-LSB4 |
| D, E | t5 | CC1 | I3 | B-LSB3 | B1 to B4, GV, B-MSB to B-LSB4 |
| C | t6 | CC1 + CC2 + CC3 + CC4 | I3 | GV | B1 to B4, B-MSB to B-LSB3 |
| D, E | t7 | CC1 | I2 | B-LSB2 | B1 to B4, GV, B-MSB to B-LSB3 |
| C | t8 | CC1 + CC2 + CC3 + CC4 | I2 | GV | B1 to B4, B-MSB to B-LSB2 |
| D, E | t9 | CC1 | I1 | B-LSB1 | B1 to B4, GV, B-MSB to B-LSB2 |
| C | t10 | CC1 + CC2 + CC3 + CC4 | I1 | GV | B1 to B4, B-MSB to B-LSB1 |
| D, E | t11 | CC1 | I0 | B-LSB0 | B1 to B4, GV, B-MSB to B-LSB1 |

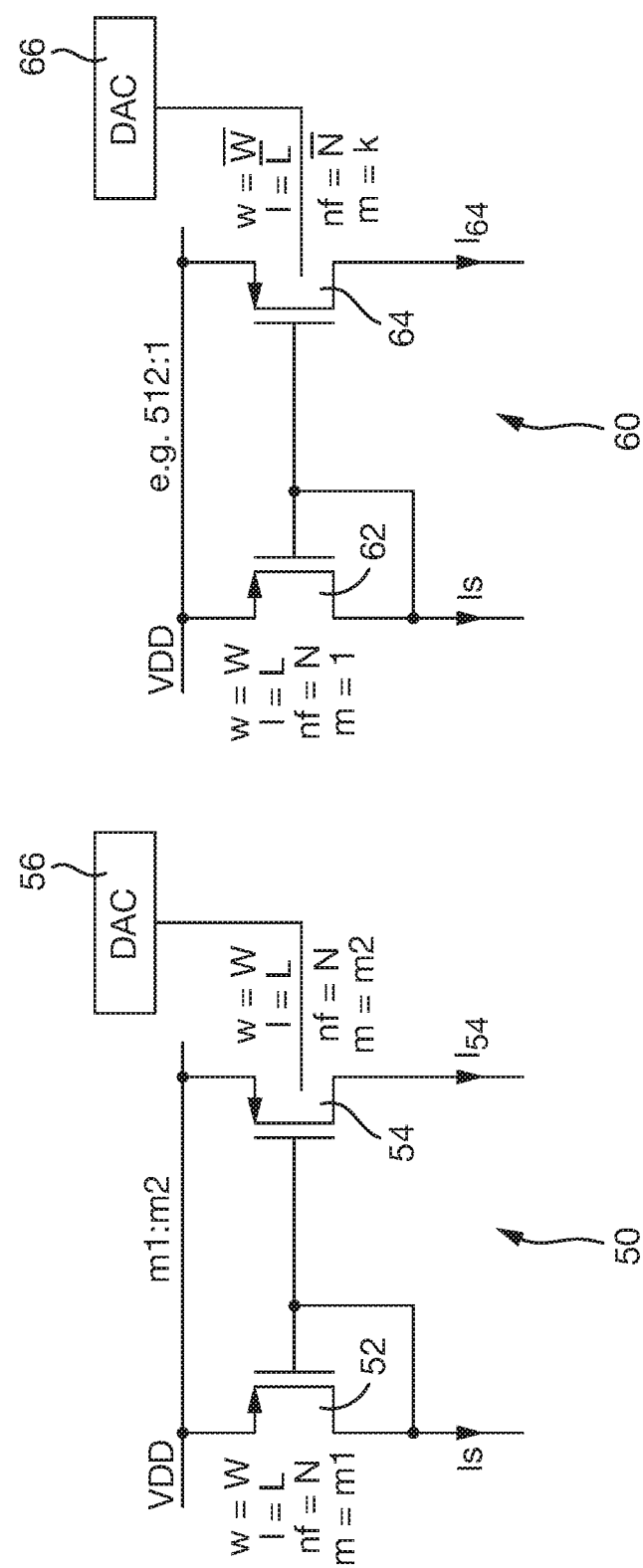

CURRENT GENERATION

CROSS-REFERENCE TO RELATED APPLICATIONS

The present application claims priority to European Patent Application No. 18192125.5, filed on Aug. 31, 2018. The disclosure of the prior application is incorporated by reference in its entirety.

The present invention relates to current generation, in particular to current-generation circuitry and methods of generating currents in such current-generation circuitry.

Such current-generation circuitry may be (or form part of) digital-to-analogue converter (DAC) circuitry or other suitable circuitry. Such circuitry may be implemented as integrated circuitry, for example on an IC chip.

It is known in DACs to use a so-called segmented architecture. As background information, FIG. 1 shows an overview of an example segmented DAC. The DAC in FIG. 1 is part of a DAC integrated circuit (IC) of the current-steering type, and is designed to convert an m-bit binary input word (D1-Dm), i.e. a digital input signal, into a corresponding analogue output signal.

Referring to FIG. 1, the DAC 1 contains analogue circuitry including a number n of identical current sources $2_1$ to $2_n$, where $n=2^{m-1}$. Each current source 2 passes a substantially constant current I. The analogue circuitry further includes a number n of differential switching circuits $4_1$ to $4_n$ corresponding respectively to the n current sources $2_1$ to $2_n$. Each differential switching circuit 4 is connected to its corresponding current source 2 and switches the current I produced by the current source either to a first terminal, connected to a first connection line A of the converter, or a second terminal connected to a second connection line B of the converter.

Each differential switching circuit 4 receives one of a plurality of digital control signals T1 to Tn (called "thermometer-coded signals" for reasons explained hereinafter) and selects either its first terminal or its second terminal in accordance with the value of the signal concerned. A first output current $I_A$ of the DAC 1 is the sum of the respective currents delivered to the first terminals of the differential switching circuit, and a second output current $I_B$ of the DAC 1 is the sum of the respective currents delivered to the second terminals of the differential switching circuit.

In the FIG. 1 example, the analogue output signal is the voltage difference $V_A$-$V_B$ between a voltage $V_A$ produced by sinking the first output current $I_A$ of the DAC 1 into a resistance R and a voltage $V_B$ produced by sinking the second output current $I_F$ of the converter into another resistance R. Of course, the analogue output signal could equally be taken as the currents $I_A$ and $I_B$ themselves, or the difference between them $I_A$-$I_B$, depending on the input requirements of circuitry operable based on the analogue output signal.

The thermometer-coded signals T1 to Tn are derived from the binary input word D1-Dm by digital circuitry including a binary-thermometer decoder 6. The decoder 6 operates as follows. When the binary input word D1-Dm has the lowest value the thermometer-coded signals T1-Tn are such that each of the differential switching circuits $4_1$ to $4_n$ selects its second terminal so that all of the current sources $2_1$ to $2_n$ are connected to the second connection line B. In this state, $V_A$=0 and $V_B$=nIR. The analogue output signal $V_A$-$V_B$=-nIR. As the binary input word D1-Dm increases progressively in value, the thermometer-coded signals T1 to Tn produced by the decoder 6 are such that more of the differential switching circuits select their respective first terminals (starting from the differential switching circuit $4_1$) without any differential switching circuit that has already selected its first terminal switching back to its second terminal. When the binary input word D1-Dm has the value i, the first i differential switching circuits $4_1$ to $4i$ select their respective first terminals, whereas the remaining n-i differential switching circuits $4_{i+1}$ to $4_n$ select their respective second terminals. The analogue output signal $V_A$-$V_B$ is equal to (2i-n)IR.

Thermometer coding is popular in DACs of the current-steering type because, as the binary input word increases, more current sources are switched to the first connection line A without any current source that is already switched to that line A being switched to the other line B. Accordingly, the input/output characteristic of the DAC is monotonic and the glitch impulse resulting from a change of 1 in the input word is small.

In practice, it is not usual to apply such a segmented architecture to all bits of the DAC (i.e. where all of the segments contribute equally to the analogue output signal) since to do so would require very large numbers of segments. Accordingly, such segmentation is usually applied only to the most significant bits of the DAC, for example the six most significant bits. This requires a total of 63 identical segments. For the remaining bits of the DAC (the least significant bits or LSBs), a non-segmented architecture may be used. In this case, the contribution of the currents for the LSBs to the analogue output signal needs to be scaled appropriately relative to the contribution of the currents in the MSB segments. In other words, the highest LSB needs to contribute a current of half each of the MSB segments, the second-highest LSB needs to contribute a current of one quarter of each of the MSB segments, and so on.

One possibility is to use in each LSB circuit circuitry that is basically the same as the circuitry in each MSB segment. The circuitry will typically comprise at least a current source or current sink and a selection switch. Also, depending on the application of the overall DAC, each MSB segment may also have other components, for example output cascodes, current bleed circuits, and so on. The currents flowing in the LSB circuits may be scaled down in comparison with the currents flowing in each MSB segment, by scaling all of the corresponding components in the LSB circuits. For example, in this case not only need the current source or sink be scaled, but so also the selection switch and any associated cascode. However, such scaling of the components in the LSB circuits presents several problems, for example in relation to hitting minimum device sizes and accuracy of the scaling.

To avoid having to scale down the currents flowing in LSB circuits in comparison with the currents flowing in each MSB segment it is possible to use in each LSB circuit circuitry that is the same as the circuitry in each MSB segment (so that the currents flowing in the LSB circuits are the same as those flowing in each MSB segment), and then scale the contributions made by those segments to the overall DAC output current appropriately using an impedance ladder (e.g. a resistive ladder). See for example FIGS. 5 and 6 of EP2019490. However, in that case the impedance ladder accuracy becomes a critical issue particularly as the currents involved become very small.

It is desirable to provide improved current-generation circuitry and methods of generating currents in such current-generation circuitry, where such current-generation circuitry may be (or form part of) digital-to-analogue converter (DAC) circuitry or other suitable circuitry. Increased accuracy and speed (leading to small device sizes), along with reduced area and power consumption, are desirable.

According to a first aspect of the present disclosure, there is provided current-generation circuitry, comprising: a plurality of candidate current sources operable to generate respective candidate currents; an output current source operable to generate an output current; comparator circuitry; and control circuitry operable to control the current sources and the comparator circuitry and connections therebetween to: in an adjustment step, generate an adjustment current by selecting one of the candidate currents or by summing together a plurality of the candidate currents, and calibrate at least a plurality of the candidate current sources including each candidate current source which contributes to that adjustment current by comparing that adjustment current to a comparative current using the comparator circuitry and adjusting control signals applied to the candidate current sources being calibrated to adjust their candidate currents until that adjustment current and the comparative current are brought into a defined relationship; and in a calibration step, following the adjustment step, generate a reference current by selecting one of the candidate currents generated by the candidate current sources calibrated in the adjustment step or by summing together a plurality of the candidate currents generated by those candidate current sources, and calibrate the output current source by comparing its output current to that reference current and adjusting a control signal applied to that output current source to adjust its output current until its output current and that reference current are brought into a defined relationship.

In the context of segmented DAC circuitry, the output current source could be considered to correspond to a DAC segment (DAC slice), and the candidate current sources could be considered as internal circuitry useful for calibrating the DAC circuitry. Thus, the output current may form at least part of or contribute to the overall analogue output signal of the DAC circuitry. The current-generation circuitry could be considered such DAC circuitry, or part of such DAC circuitry. Of course, output current sources may be used in other contexts, separate from DAC circuitry.

The circuitry could be implemented using field-effect transistors, in particular MOSFETs. In that case, each current source may be implemented as or by a MOSFET, or comprise a plurality of MOSFETs. In that context, control signals may comprise gate voltage signals and/or bulk voltage signals.

The comparator circuitry may comprise one or more comparators. It may be advantageous to use the same comparator to perform multiple or all comparisons.

The control circuitry may comprise switching circuitry so as to be able to control connections between current sources (i.e. current paths carrying their currents) and the comparator circuitry. The control circuitry may comprise logic circuitry in order to control the steps and their order. Such logic circuitry may be implemented in hardware and/or in software executed on a processor.

The adjustment step may comprise summing together a plurality of the candidate currents, and calibrating at least the candidate current sources which generate that adjustment current by comparing that adjustment current to the comparative current and adjusting the control signals applied to the candidate current sources being calibrated to reduce (rather than increase) their candidate currents until that adjustment current and the comparative current are brought into the defined relationship. The comparative current may be smaller than the adjustment current. This provides a way of generating accurate small currents from larger currents.

The comparative current may be substantially equal to the candidate current of one of the candidate current sources calibrated in the adjustment step prior to that calibration, i.e. to the candidate current concerned before it is calibrated.

The candidate current sources may each comprise a field-effect transistor, and the control signals adjusted in the adjustment step may be gate voltages of the transistors concerned. The transistors concerned may be provided with a common gate voltage. The adjustment of the control signals in the adjustment step may be carried out while maintaining the bulk voltages of the transistors concerned.

The control signals adjusted in the adjustment step may be adjusted together to adjust the candidate currents concerned together, i.e. at the same time and/or in the same way. In this way, the relationship between the candidate currents concerned may remain the same (for example, they may remain mutually equal).

The output current source may comprise a field-effect transistor. The control signal adjusted in the calibration step may be or comprise a bulk voltage of the transistor concerned.

In the adjustment step the control signals applied to the candidate current sources being calibrated may be adjusted to reduce their candidate currents until that adjustment current and the comparative current are brought into the defined relationship. In the adjustment step the number of candidate currents summed together to generate the adjustment current may be a large number (e.g. 4), and in the calibration step the number of candidate currents comprised by the reference current may be a small number (e.g. 1) in that it is smaller than said large number. These numbers may be positive integers.

In the adjustment step the control signals applied to the candidate current sources being calibrated may be adjusted to reduce their candidate currents until that adjustment current and the comparative current are brought into the defined relationship. The current-generation circuitry may comprise a plurality of said output current sources operable to generate respective output currents. The control circuitry may be operable, following the adjustment step and the calibration step, to successively perform a further said adjustment step followed by a further said calibration step. In each further adjustment step, the adjustment current may be generated by summing together a plurality of the candidate currents generated by the candidate current sources calibrated in the preceding calibration step. In each further calibration step, the output current source which is calibrated may be another one of the output current sources from the one of the output current sources calibrated in the preceding calibration step. In this way, it may be possible to successively calibrate output current sources to have successively smaller currents, defined relative to one another with a good degree of accuracy.

In each further adjustment step, the comparative current may be (or be related to or derived from) the output current as adjusted in the preceding calibration step.

In each further adjustment step the number of candidate currents summed together to generate the adjustment current may be a large number in that it is larger than the number of candidate currents comprised by the reference current of the preceding calibration step. In each further calibration step the number of candidate currents comprised by the reference current may be a small number in that it is smaller than the number of candidate currents summed together to generate the adjustment current of the preceding adjustment step. Such large numbers may be the same as one another. Such small numbers may be the same as one another. The number of candidate current sources in the plurality of candidate current sources may be equal to a said large number or the largest of said large numbers.

The current-generation circuitry may comprise a plurality of said output current sources operable to generate respective output currents. The control circuitry may be operable, in an initial step, preceding said adjustment step, to generate a reference current by selecting one of the candidate currents generated by the candidate current sources or by summing together a plurality of the candidate currents generated by the candidate current sources, and to calibrate another one of the output current sources by comparing its output current to that reference current using the comparator circuitry and adjusting a control signal applied to that output current source to adjust its output current until its output current and that reference current are brought into a defined relationship.

The reference current generated in the initial step may be a small reference current. The control circuitry may be operable, in the initial step, to generate a large reference current by summing together a plurality of the candidate currents (e.g. more of them than comprised by the small reference current) generated by the candidate current sources such that the large reference current is larger than the small reference current, and to calibrate another one of the output current sources by comparing its output current to that large reference current using the comparator circuitry and adjusting a control signal applied to that output current source to adjust its output current until its output current and that large reference current are brought into a defined relationship.

The control circuitry may be operable, in a candidate-setup step, optionally preceding each other said step (i.e. any other step, or before the first of the other steps which is performed), to calibrate each of said candidate current sources by, for each of those candidate current sources, comparing its candidate current to a calibration current using the comparator circuitry and controlling a control signal applied to that candidate current source until those currents are brought into a defined relationship. The calibration current may be the same for each of the candidate current sources, for example for calibrating the candidate current sources concerned so that their candidate currents are substantially equal (equal to a high degree of accuracy, defined by the accuracy of the comparison process).

The candidate current sources may each comprise or be a field-effect transistor. The control signals adjusted in the candidate-setup step may be or comprise bulk voltages of the transistors concerned. The adjustment of the control signals in the candidate-setup step may be carried out while maintaining the gate voltages of the transistors concerned.

According to a second aspect of the present disclosure, there is provided current-generation circuitry, comprising: a plurality of candidate current sources operable to generate respective candidate currents; a plurality of output current sources operable to generate respective output currents; comparator circuitry; and control circuitry operable to control the current sources and the comparator circuitry and connections therebetween to: generate a plurality of different reference currents by, for each of those reference currents, selecting one of the candidate currents or summing together a plurality of the candidate currents; and for each of at least a plurality of the reference currents, calibrate a corresponding one of the output current sources by comparing its output current to the reference current concerned using the comparator circuitry and adjusting a control signal applied to that output current source to adjust its output current until those currents are brought into a defined relationship. In this way it may be possible to calibrate the output currents concerned so that they are defined relative to one another to a high degree of accuracy (defined by the accuracy of the candidate currents and the comparison process).

The control circuitry may be operable, before generating said reference currents, to calibrate each of the candidate current sources by, for each of the candidate current sources, comparing its candidate current to a calibration current using the comparator circuitry and controlling a control signal applied to that candidate current source until those currents are brought into a defined relationship. The calibration current may be the same for each of the candidate current sources, for example for calibrating the candidate current sources concerned so that their candidate currents are substantially equal (equal to a high degree of accuracy, defined by the accuracy of the comparison process).

The candidate current sources may be calibrated using the same calibration current.

In one or more or each of the defined relationships (described above in relation to performing comparisons), the currents concerned may be substantially equal in magnitude to one another. The candidate currents may substantially equal in magnitude to one another. Substantially equal may be equal to within a defined error margin or tolerance (such as ±1% or ±0.005%).

Summing together candidate currents may comprise connecting together respective current paths carrying those candidate currents, so that those currents ultimately flow in the same current path at the same time.

Each output current source may comprise a current mirror (a current mirror circuit or current mirror arrangement) comprising field-effect transistors. Adjusting a said control signal applied to a said output current source may comprise adjusting a bulk voltage of one more field-effect transistors of the current mirror.

Each output current source may comprise a switchable current source, operable to provide an input current to the current mirror of that output current source in dependence upon a digital input signal. For each output current source, the current mirror may be operable to provide the output current based on the input current. The current-generation circuitry may be configured to combine the output currents from the output current sources to generate an overall output current dependent on the digital input signal. As such, the current-generation circuitry may operate as a digital-to-analogue converter.

The output current sources may be configured such that their input currents have an ON value or an OFF value in dependence upon the digital input signal, the ON values being the same for the output current sources and the OFF values being the same for the output current sources. The output currents concerned may be based on the ON values.

For at least one current mirror at least one of the channel width, channel length and number of fingers (including the channel width, channel length per finger) of one or more field-effect transistors which carry an input current of that current mirror may be different from that of one or more field-effect transistors which carry an output current of that current mirror.

The comparing of currents may comprise: connecting current paths carrying the currents to be compared to a test node such that one of the currents to be compared is input to the test node and the other of the currents to be compared is drawn from the test node; connecting the test node to a target voltage source so as to bias a test voltage at the test node at a target voltage level; and after biasing the test voltage at the target voltage level, disconnecting the test node from the voltage source and monitoring the test voltage. If the currents to be compared are different from one another then a parasitic or discrete capacitance between the test node and the target voltage source will be charged (positively or negatively) creating a potential difference over that capacitance which can be monitored.

The control circuitry may be operable, for each comparing of currents, to adjust the control signal or control signals concerned and repeat the comparing until after biasing the test voltage at the target voltage level and disconnecting the test node from the voltage source the test voltage does not change from the target voltage level beyond a threshold amount or until the test voltage drifts from the target voltage level in opposite directions for adjacent values of the control signal or control signals concerned.

According to a third aspect of the present disclosure, there is provided current-generation circuitry, comprising: a plurality of candidate current sources operable to generate respective candidate currents, wherein the candidate current sources are implemented as field-effect transistors; comparator circuitry; and control circuitry operable to control the current sources and the comparator circuitry and connections therebetween to: calibrate each of the candidate current sources by, for each of the candidate current sources, comparing its candidate current to a calibration current using the comparator circuitry and controlling a control signal applied to that candidate current source to control its bulk voltage until those currents are brought into a defined relationship; and after calibrating each of the candidate current sources, connect a first number of the candidate current sources in parallel and diode-connect them to form the input side of a current mirror, connect a second number of the candidate current sources in parallel to form the output side of a current mirror, wherein the gate terminals of the candidate current sources are connected together and the source terminals of the candidate current sources are connected together.

Such current-generation circuitry may be used to generate an accurate current mirror with a defined mirror ratio.

According to a fourth aspect of the present disclosure, there is provided current-generation circuitry, comprising: a plurality of output current sources operable to generate respective output currents, each output current source comprising a current mirror configured to output the output current concerned based on a corresponding input current; reference circuitry operable to generate at least one reference current; and control circuitry operable to calibrate the current mirror of at least one (or some or all) of the output current sources by comparing its output current to a said reference current and controlling a control signal applied to that current mirror to adjust its output current until its output current and that reference current are brought into a defined relationship.

According to a fifth aspect of the present disclosure, there is provided a digital-to-analogue converter comprising the current-generation circuitry of any of the aforementioned aspects.

According to a sixth aspect of the present disclosure, there is provided integrated circuitry such as an IC chip comprising the current-generating circuitry of any of the aforementioned first to fourth aspects or the digital-to-analogue converter of the aforementioned fifth aspect.

The present disclosure extends to seventh to twelfth method aspects corresponding to the aforementioned first to sixth apparatus (circuitry) aspects, respectively. Features of apparatus aspects apply to method aspects mutatis mutandis, and vice versa.

Reference will now be made, by way of example only, to the accompanying drawings, of which:

FIG. 1, as mentioned above, presents an overview of an example segmented DAC;

FIG. 4 is a schematic diagram of segmented DAC circuitry according to a running example;

FIG. 8 is a table illustrating a particular implementation of the method steps explained in connection with FIGS. 6 and 7, for implementing the segmented DAC circuitry of FIG. 4;

FIG. 11 is a schematic diagram useful for exploring the benefits of the arrangements disclosed herein.

To avoid having to scale down the currents flowing in LSB circuits in comparison with the currents flowing in each MSB segment and also avoid using an impedance ladder, it is possible to use in each LSB circuit circuitry that is the same as the circuitry in each MSB segment (so that the currents flowing in the LSB circuits are the same as those flowing in each MSB segment) and use appropriately ratioed current mirrors in the LSB circuits to scale down the corresponding currents which they contribute to the analogue output signal. For example, the highest LSB may use a 2:1 current mirror to contribute a current of half each of the MSB segments.

If such current mirrors are also used in the MSB segments, with appropriate ratios (such as 1:1), then the LSB circuits and the MSB segments may become the same as one another, except for the difference between the ratios adopted in the current mirrors. This enables a segmented architecture to be adopted, for example grouping the segments into segment groups.

Figure 2:
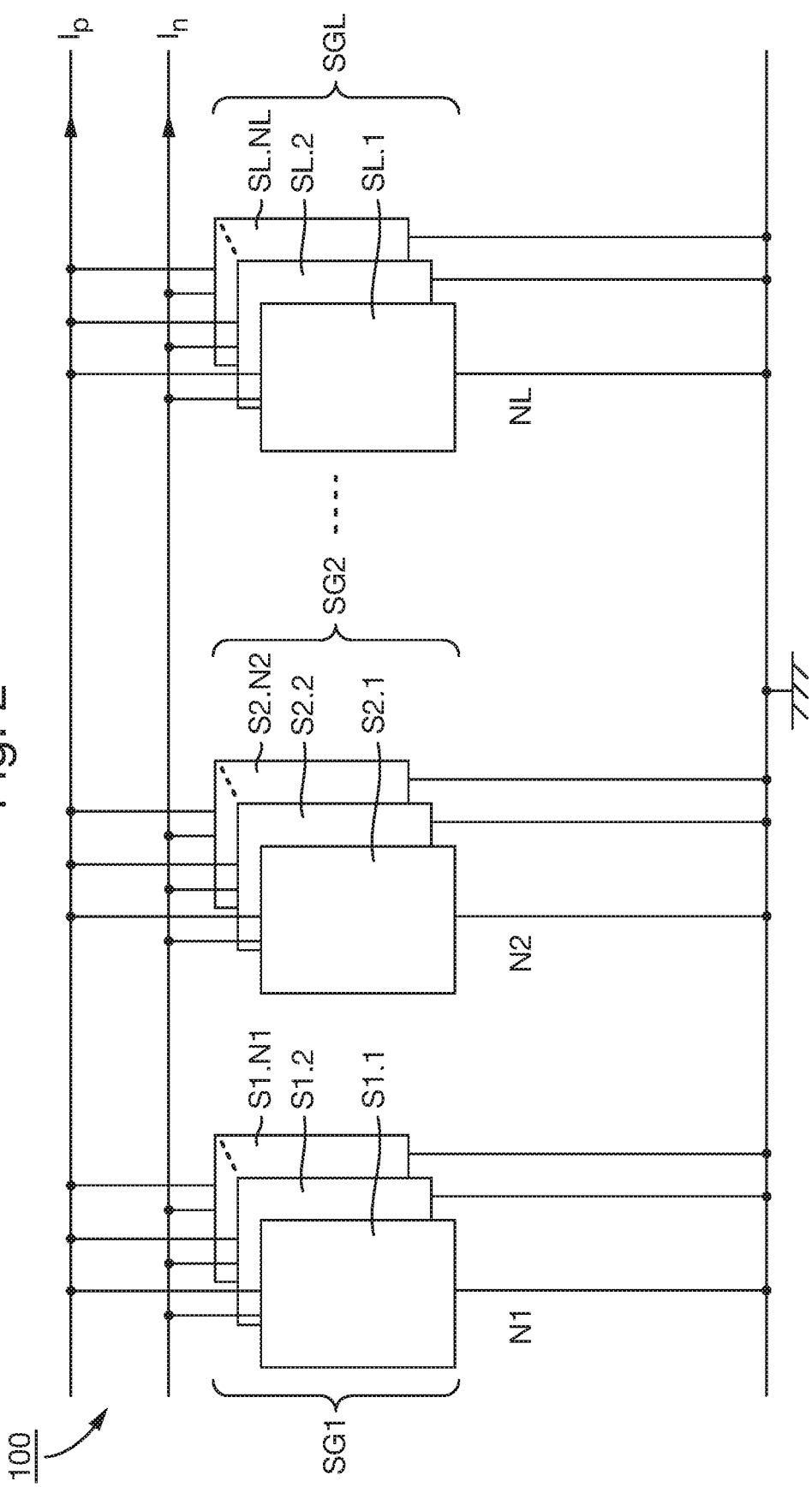
FIG. 2 is a schematic diagram of segmented DAC circuitry according to an example arrangement.

FIG. 2 is a schematic diagram of segmented digital-to-analogue converter (DAC) circuitry 100 according to an example arrangement. Segmented DAC circuitry 100 comprises L segment groups SG1, SG2 . . . SGL (where L is an integer and is at least 2). Each segment group corresponds to one or more bits of a binary input word (i.e. a digital input signal, corresponding to the binary input word D1-Dm as described above). Such a binary input word is decoded by a binary-thermometer decoder (corresponding to the binary-thermometer decoder 6 described above) to produce thermometer-coded signals (corresponding to the thermometer-coded signals T1 to Tn described above) which control the segments of the segment groups in accordance with the binary input word.

Each segment group SG1 to SGL comprises one or more segments, and typically at least three segments (so as to represent at least 2 bits of the binary input word). For example, segment group SG1 comprises N1 segments S1.1 to S1.N1, segment group SG2 comprises N2 segments S2.1 to S2.N2, and segment group SGL comprises NL segments SL.1 to SL.NL. The segment groups may comprise different numbers of segments (N1, N2, . . . NL) from one another.

One or more segments of each group may correspond to one or more bits of the binary input word. For example, a segment group may contain one segment with that segment group corresponding to 1 bit in the binary input word. In that case, the segment may be controlled to be ON for binary 1 and OFF for binary 0. As another example, a segment group may contain three segments with that segment group corresponding to 2 bits of the binary input word. In that case, the segments may be controlled to be all ON for binary "11" and all OFF for binary "00", using thermometer decoding. That is, the output of a segment (or of a plurality of segments of a particular segment group together) may correspond to one or more bits of the binary input word.

Each segment group may additionally comprise one or more so-called "dummy" (or spare/redundant) segments. For example, where a segment group corresponds to 2 bits it may contain four segments, with three of those segments being active (on duty) at any one time in the sense of contributing to the analogue output signal (to enable the full range of values expressed by those 2 bits) and one of those segments being a dummy segment, i.e. inactive (off duty) in the sense of not contributing to the analogue output signal (for example by being disconnected from the overall DAC output). Which one of the four segments is off duty at any one time may be changed over time, e.g. in a repeating cycle, with the current off duty segment being calibrated (or its performance being measured in some way) so that all of the segments are calibrated over time during run time operation of the DAC circuitry 100. A dummy segment may similarly be provided as a "back-up segment" in case any problem/interference causes one of the other segments to be unusable in the operation of the segmented DAC circuitry 100.

Segmented DAC circuitry 100 is illustrated in FIG. 2 as differential circuitry. That is, each segment comprises two output nodes, a "positive" output node and a "negative" output node, to output two corresponding currents which may be referred to as output currents. Segmented DAC circuitry 100 outputs a "positive" output current Ip and a "negative" output current In, and each segment contributes an output current via its positive output node to the positive output current Ip and another output current via its negative output node to the negative output current In.

Figure 3A:
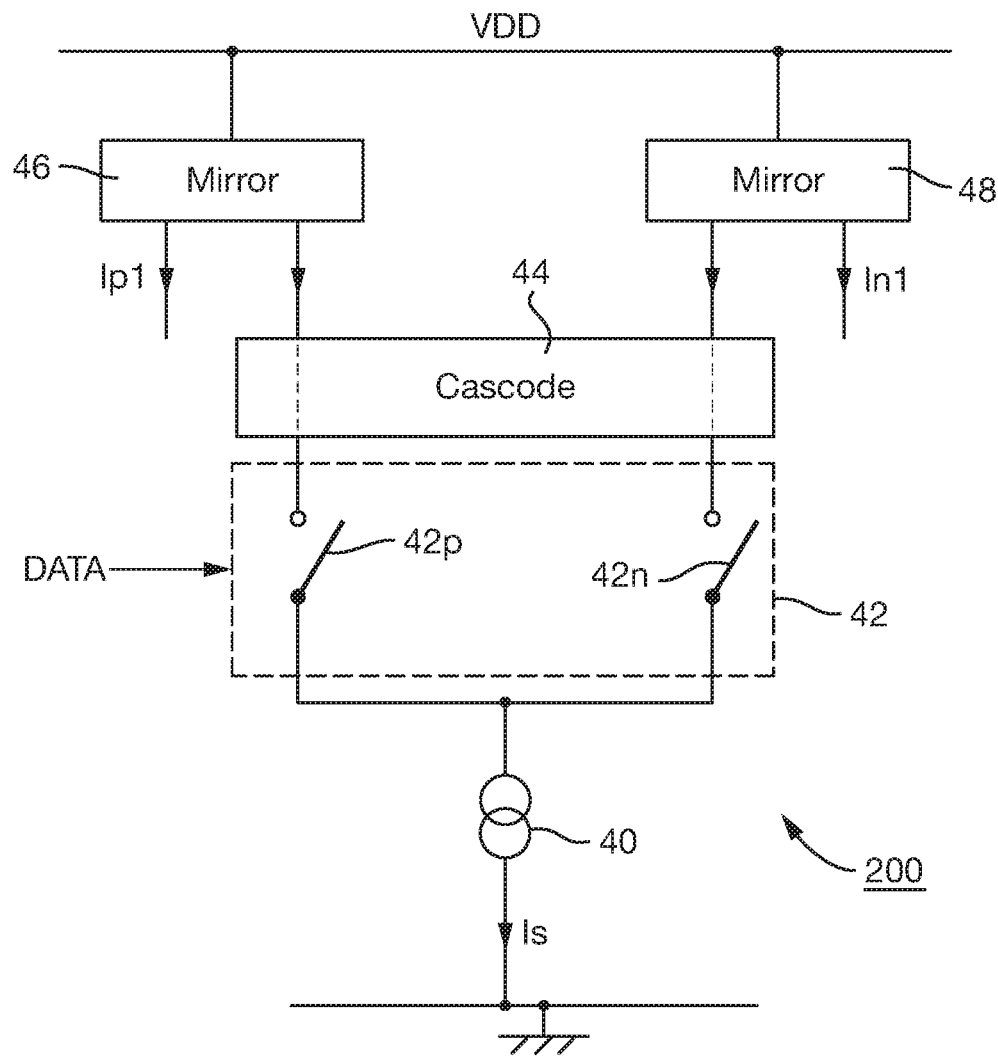
FIG. 3A is a schematic diagram of example segment circuitry of a segment of the segmented DAC circuitry of FIG. 2.

FIG. 3A is a schematic diagram of example segment circuitry 200 of a segment of the segmented DAC circuitry 100, for example the segment S1.1.

As apparent from FIG. 3A, each segment comprises switching circuitry so that one of the two output currents output from the segment is always "on" and so that one of the two output currents output from the segment is always "off". Thus, each segment may be considered to effectively steer a current to one of its output nodes dependent on whether it is configured to be ON or OFF (i.e. dependent on the binary input word). For example, each segment may be considered to steer its current to its positive output node when it is configured to be ON and to its negative output node when it is configured to be OFF. In this scenario (as depicted in FIG. 3A) one of the two output currents of each segment will be zero at any time.

In another arrangement, each segment may be configured to steer a big current to its positive output node and a small current to its negative output node when it is configured to be ON, and vice versa when it is configured to be OFF, so that both of the two output currents of each segment will have a positive value at any one time. In another arrangement segmented DAC circuitry 100 may of course be implemented as single-ended circuitry and output a single DAC output current instead of positive and negative output currents (in this case each segment may output a single output current). The present disclosure will be understood accordingly.

Although not clearly shown in FIG. 2, as apparent from FIG. 3A each segment is connected between VDD and ground supply and to output an output current Ip1 contributing to the positive output current Ip of the segmented DAC circuitry 100 and an output current In1 contributing to the negative output current In of the segmented DAC circuitry 100.

Looking at FIG. 3A, segment circuitry 200 comprises a current source 40, switching circuitry 42, cascode circuitry 44, a "positive" current mirror 46 and a "negative" current mirror 48. Although current source 40 may be described as a current sink, it will be referred to as a current source herein for simplicity (a current sink being a type of current source).

The switching circuitry 42 is connected between the current source 40 and the cascode circuitry 44. The cascode circuitry 44 is connected between the switching circuitry 42 and the current mirrors 46 and 48. The cascode circuitry 44 comprises two outputs connected respectively to the positive current mirror 46 and to the negative current mirror 48.

The switching circuitry 42 comprises a "positive" switch 42p connected between the current source 40 and the positive current mirror 46, via the cascode circuitry 44 with the effective current path indicated through the cascode circuitry 44 by a dashed line. Similarly, the switching circuitry 42 comprises a "negative" switch 42n connected between the current source 40 and the negative current mirror 48, via the cascode circuitry 44 with the effective current path again indicated through the cascode circuitry 44 by a dashed line. The voltage potentials at the outputs of each segment (inputs to the current mirrors) vary in use in accordance with the applied binary input word. The cascode circuitry 44 in each segment serves to shield the corresponding switching circuitry 42 from such potential variations. In some arrangements, the cascode circuitry 44 could be omitted with the currents from the switches 42p/42n flowing along the dashed line paths. The switches 42p/42n, the cascode circuitry 44 and the current mirrors 46, 48 may be implemented with field-effect transistors (e.g. MOSFETs).

In use, a control signal (indicated as a DATA signal) is applied to the switching circuitry 42 dependent on the binary input word (i.e. the digital data), and this causes either the positive switch 42p or the negative switch 42n to turn ON (and the other of them to turn OFF).

The current source generates a segment current is (this being the same for all segments in the present example). When the DATA signal is for configuring the segment to be ON, the positive switch 42p is turned ON (i.e. closed) and the negative switch 42n is turned OFF (i.e. open). In that case, the segment current Is is steered to the positive side and is mirrored by the positive current mirror 46 to generate the output current Ip1 as a contribution to the positive output current Ip of the segmented DAC circuitry 100. The corresponding output current In1, as a contribution to the negative output current In of the segmented DAC circuitry 100, then has a zero value. Similarly, when the DATA signal is for configuring the segment to be OFF, the negative switch 42n is turned ON (i.e. closed) and the positive switch 42p is turned OFF (i.e. open). In that case, the segment current Is is steered to the negative side and is mirrored by the negative current mirror 48 to generate the output current In1. The corresponding output current Ip1 then has a zero value. In practice, rather than a zero value current as mentioned here the segments may be configured to cause a small current to flow to keep devices operating—leading to a DC shift at the output. However, for ease of understanding zero value currents will be assumed as mentioned above.

In an alternative arrangement of the switching circuitry 42, each of the switches 42p and 42n could be replaced by a parallel connection of a plurality of like switches. This would enable one such switch to be turned on and another to be turned off both when the data (the binary input word) changes and when it stays the same, so that noise interference caused by those switches switching is data-independent.

Figure 3B:
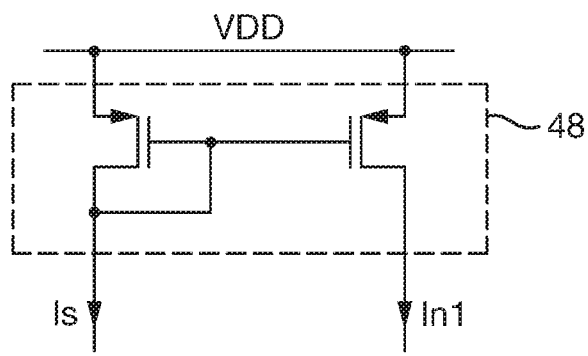
FIG. 3B is a schematic diagram of part of the segment circuitry of FIG. 3A.

Current mirrors 46 and 48 are identical. For ease of understanding FIG. 3A, an example implementation of current mirror 48 is shown in FIG. 3B, which is a schematic diagram of part of the segment circuitry 200. In FIG. 3B, it is assumed that the segment of the segment circuitry 200 is configured to be OFF, so that the segment current Is is received by the current mirror 48.

Each current mirror 46 and 48 comprises an input node from which a respective current is drawn (ultimately by the current source 40, via the cascode circuitry 44 and the switching circuitry 42) as an input current and an output node to output an output current. The positive current mirror 46 outputs the output current Ip1 and the negative current mirror 48 outputs the output current In1 as mentioned above.

The current mirrors 46 and 48 each output an output current that has a given ratio with its input current, dependent on its structure. The input current (the current being copied or mirrored) may be considered a master current in which case the output current may be considered a slave current in the sense that it is dependent on the master current.

For example, as apparent from FIG. 3B, the current mirrors may be implemented by field-effect transistors (e.g. MOSFETs), in which case the relative dimensions/structures of the transistor(s) carrying the input current to those of the transistor(s) carrying the output current will affect the given ratio. Factors which may be taken into account here include channel width W, channel length l, number of fingers nf, number of devices m (each transistor shown in FIG. 3B may be implemented as one or more transistors in practice), and bulk voltage. The ratio of a current mirror's input current to its output current is hereinafter referred to as that current mirror's current mirror ratio (input:output). This will be explored in more detail later herein, for example in connection with FIG. 11.

The current mirror ratio of the positive current mirror 46 is the same as the current mirror ratio of the negative current mirror 48, in the present example. The current mirror ratios of respective current mirrors of the segments in a segment group are also assumed to be the same, so that their output currents (given the same DATA signals) will contribute to the positive and negative output currents of the segmented DAC circuitry 100 in the same way. Generally, the current mirror ratios of the current mirrors of segments in one segment group are different from the current mirror ratios of current mirrors of segments in another segment group.

FIG. 4 is a schematic diagram of segmented DAC circuitry 101 according to a running example. Segmented DAC circuitry 101 is a particular configuration of the segmented DAC circuitry 100 of FIG. 2.

The segmented DAC circuitry 101 is shown as single-ended circuitry in FIG. 4 for simplicity, and thus to have a single-ended DAC output current Iout. However, it will be understood that the segmented DAC circuitry 101 is implemented as differential circuitry, with each segment (including dummy segments, in some arrangements) outputting two differential output currents, and the segmented DAC circuitry 101 having corresponding differential positive and negative output currents, in line with the segmented DAC circuitry 100. The single-ended DAC output current Iout could for example be taken to be representative of one of the positive and negative output currents.

Segmented DAC circuitry 101 comprises six segment groups MSB, LSB4, LSB3, LSB2, LSB1 and LSB0. In the running example, the binary input word (the input digital signal, or data) comprises 15 bits, i.e. bits 0 to 14 from least significant to most significant bit. As indicated in FIG. 4, the upper five bits of the input binary word (starting from the most significant bit) control the segment group MSB (i.e. "Most Significant Bit Group") and thus the contribution to the DAC output current Iout of its segments. The next 2 bits of the input binary word control the segment group LSB4 ("Least Significant Bit Group 4") and thus the contribution to the DAC output current Iout of its segments. The next 2 bits of the input binary word control the segment group LSB3 ("Least Significant Bit Group 3") and thus the contribution to the DAC output current Iout of its segments. The next 2 bits of the input binary word control the segment group LSB2 ("Least Significant Bit Group 2") and thus the contribution to the DAC output current Iout of its segments. The next 2 bits of the input binary word control the segment group LSB1 ("Least Significant Bit Group 1") and thus the contribution to the DAC output current Iout of its segments. The last (i.e. least significant) 2 bits of the input binary word control the segment group LSB0 ("Least Significant Bit Group 0") and thus the contribution to the DAC output current Iout of its segments.

In the running example, the segment group MSB comprises 31 segments (to enable 5-bit resolution using thermometer decoding) along with one additional dummy segment, and the segment groups LSB4 to LSB0 each comprise 3 segments (to enable 2-bit resolution using thermometer decoding) along with one additional dummy segment. Therefore, the segmented DAC circuitry 101 comprises 52 (32+4+4+4+4+4) segments in total. In a corresponding arrangement without the dummy segments, the segmented DAC circuitry 101 would comprise 46 (31+3+3+3+3+3) segments in total.

It will of course be appreciated that in other arrangements the input binary word may comprise another number of bits. Also, there may be a different number of segment groups and the segment groups may correspond with different numbers of bits of the input binary word. Further, the segments groups may comprise different numbers of segments. The arrangement shown in FIG. 4 is simply an example.

In FIG. 4, the boxes in each segment group are each representative of a current mirror such as current mirror 46 of a corresponding segment of the group concerned, with the rest of the segment circuitry not shown for simplicity. Further, FIG. 4 is presented assuming that all of the segments are configured to be ON such that the segment current Is concerned is drawn from the current mirror of that segment as shown. Indeed, the following description is best understood assuming that while the current mirrors of the segments are calibrated (as explained later), the segment current Is concerned is drawn from the current mirror concerned. Each segment of the segment groups MSB and LSB4 to LSB0 draws the same segment current Is from its current mirror when configured to be ON.

Each segment (when configured to be ON) then contributes a current (the output current of its current mirror) to the overall DAC output current Iout as shown. For simplicity these currents are only shown for one segment per segment group in FIG. 4, however it will be understood that, for a given segment group, each of its segments when configured to be ON contributes the same current to the overall DAC output current Iout. Thus, the output current output from each segment (excluding the dummy segment or segments) in a segment group can be summed to give the combined output current for that segment group.

Segments of the segment group MSB are each configured to output an output current Im, and segments of the segment groups LSB4 to LSB0 are configured to output output currents I4, I3, I2, I1 and I0, respectively, again when configured to be ON (i.e. dependent on the binary input word, which would be at full scale to turn ON all of the segments in FIG. 4). It is assumed here for simplicity that when configured to be OFF the output currents of the segments have a zero magnitude (because the segment currents Is in that case are not drawn from the current mirrors associated with the overall DAC output current Iout).

Thus, if all of the current mirrors were configured in the same way, then Im=I4=I3=I2=I1=I0, however this is not the case. Instead, in the running example, the current mirrors of the segments are the configured in the same way within a segment group, but differently from segment group to segment group, so that the contributions to the overall DAC output current Iout made by the output currents are scaled from segment group to segment group.

In detail, looking at FIG. 4, the magnitude of an output current I4 output from a segment of the segment group LSB4 (i.e. and LSB4 segment) is ¼ of an output current Im output from an MSB segment. Hereinafter, two currents being equal is taken to mean that the magnitudes of those currents are equal. Each successive output current I4 to I0 is ¼ of the preceding output current in the order I4 to I0. The output currents Im and I4 to I0 output from segments of the respective segment groups MSB and LSB4 to LSB0 satisfy Im=4*I4=16*I3=$_{64}$*I2=256*I1=1024*I0, so that the output current I0 is 1/1024 that of the output current Im.

It is noted that the output current I0 is 1/1024 that of the output current Im. It is a significant challenge to achieve the necessary current mirrors to achieve this, i.e. in the LSB0 segment group in particular, with each having the required accuracy of at least <½ LSB. As will become apparent later in connection with FIG. 11, generally to get good accuracy requires a large area per device and to get a good ratio requires a large number of devices to be accurately matched. However, a large area increase the parasitics (parasitic capacitances) and this limits the bandwidth of the overall DAC circuitry.

It will of course be appreciated that other output currents may be used, and that the ratio between successive output currents need not be the same, depending on the application. Further, the ratio between successive output currents need not be in the form 1:X where X is an integer—that is, ratios may be of the form X:Y, where X and Y are integers.

Generally, the segment current Is supplied to each segment may be chosen such that suitable output currents (and therefore a suitable DAC output current Iout of the segmented DAC circuitry 101) may be obtained. In the running example, the segment current Is is chosen so that to obtain a suitable DAC output current Iout the current mirror ratio of the current mirrors of segments of the segment group MSB (the current mirror ratio of the segment group MSB) should be 1:2 (in the form input:output described above). That is, a suitable output current Im (and therefore a suitable DAC output current Iout) may be obtained when the current mirror ratio the segment group MSB is 1:2. Therefore, the current mirror ratios of the segment groups LSB4 to LSB0 are configured to be, respectively, 2:1, 8:1, 32:1, 128:1 and 512:1 to obtain the desired ratios between successive output currents of the segment groups in the segmented DAC circuitry 101 in this case, given the allocation of bits of the binary input word (the input digital data) as indicated.

Given accuracy and circuit area constraints, a current mirror with a current mirror ratio of 512:1 is easier to implement than a current mirror with a current mirror ratio of 1024:1, as is described below. Choosing the current mirror ratio of the segment group MSB to be 1:2 means that the current mirror ratio of the segment group LSB0 is 512:1 (rather than 1024:1 which would be required if the current mirror ratio of the segment group MSB were 1:1). The current mirror ratio of the segment group MSB could be higher or lower in another arrangement (for example 1:4).

As noted above, it is a challenge to achieve output current I0 as 1/1024 that of the output current Im, particularly at small currents (e.g. if the overall DAC output current Iout is intended to range from 0-10 mA, or tens of mA, then the current for 1 LSB0 segment in the FIG. 4 example given a 15-bit binary input word is approximately 305 nA or hundreds of nA). It is thus a challenge to implement the current mirrors in FIG. 4, particularly at the LSB end, with the required accuracy. It will become apparent that the DAC circuitry 101 of FIG. 4 comprises control circuitry (not shown in FIG. 4) configured to calibrate the current mirrors, by trimming bulk voltages of field-effect transistors used to implement those current mirrors.

It will of course be appreciated that the choice of the current mirror ratios of the segment groups is dependent upon the segment current Is, the desired ratios between the segment output currents between segment groups, and the desired overall DAC output current Iout. Further, in other arrangements, each segment group need not be supplied with the same segment current Is.

Figure 5:
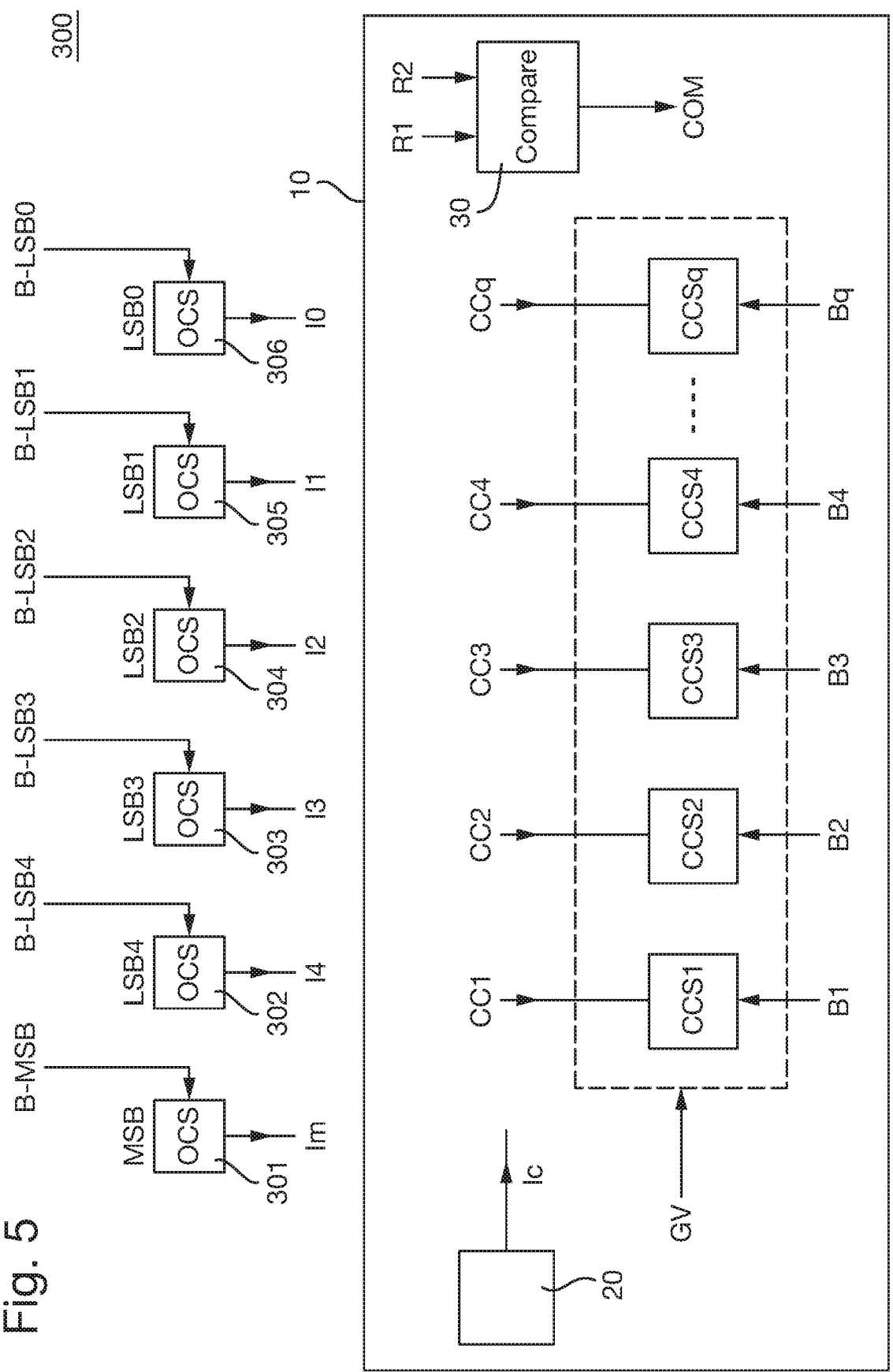
FIG. 5 is a schematic diagram of current-generation circuitry, comprising calibration circuitry along with representative output current sources.

FIG. 5 is a schematic diagram of calibration circuitry 10 along with representative output current sources 301 to 306. The calibration circuitry 10, optionally in combination with the output current sources 301 to 306, may be referred to as current-generation circuitry 300.

To facilitate understanding, calibration circuitry 10 and the output current sources are shown in "black box" form and connections between various elements are not shown fully.

Calibration circuitry 10 comprises a plurality of (i.e. q) candidate current sources CCS1 to CCSq, a calibration current source 20 and comparator (comparison) circuitry 30. Candidate current sources CCS1 to CCS4 and CCSq are explicitly shown in FIG. 5, assuming that the integer q may be greater than 4 (in some arrangements q=4). Candidate current sources CCS1 to CCSq are configured to draw respective candidate currents CC1 to CCq. Candidate current sources CCS1 to CCSq may as such be referred to as current sinks but are referred to herein as current sources for simplicity. In other arrangements candidate current sources CCS1 to CCSq may actually output candidate currents CC1 to CCq, however they are shown as drawing candidate currents CC1 to CCq for ease of comparison with FIGS. 9 and 10 described later herein.

Candidate current sources CCS1 to CCSq may be controlled by adjusting or controlling the control signals B1 to Bq, respectively. That is, for example, candidate current source CCS1 may be controlled by adjusting or controlling the control signal B1 applied to the candidate current source CCS1 to cause the candidate current CC1 drawn by the candidate current source CCS1 to change. There may be fewer or further candidate current sources CCS, each being configured to output a candidate current CC and each controllable by adjusting or controlling a corresponding control signal applied to that candidate current source. The candidate current sources CCS1 to CCSq may also be controlled by adjusting or controlling a control signal GV, which for convenience is considered to be applied in common to all of the candidate current sources CCS1 to CCSq. Of course, in general the control signal GV could be considered representative of separate such control signals GV1 to GVq per candidate current source CCS (e.g. having the same value as one another).

The calibration circuitry 10 may be configured (although not in the case of a specific example implementation described later) so that adjusting or controlling the control signal GV causes all of the control signals B1 to Bq to be adjusted. In the case of the example implementation described later, the control signal GV causes the candidate currents of the candidate current sources to be adjusted separately from the control signals B1 to Bq. In the example implementation described later, the candidate current sources CCS may be implemented as field-effect transistors (e.g. MOSFETs), in which case the control signals B1 to Bq may be for controlling bulk voltages of the corresponding transistors, and the control signal GV may be for controlling gate voltages of the corresponding transistors.

Comparator circuitry 30 comprises two inputs R1 and R2 and is configured to compare two currents applied respectively at its inputs R1 and R2 and output a control signal COM indicative of a difference between those currents. The direction of the arrows R1 and R2 into the comparator circuitry 30 is simply indicative of R1 and R2 being inputs rather than of any particular direction of current flow.

The control signal COM output from comparator circuitry 30 could for example comprise one or more of the control signals B1 to Bq, or the control signal GV. The control signal COM could be received by control circuitry (forming part of the current-generation circuitry 300, or even of the calibration circuitry 10) configured to generate one or more of the control signals B1 to Bq or the control signal GV. A particular configuration employing field-effect transistors is described in detail below as already mentioned, along with an associated implementation of the comparator circuitry 30.

The calibration current source 20 is configured to generate a calibration current Ic for use in a method of generating currents described below.

The output current sources (OCS) 301 to 306 are configured to output output currents. In this example, the output current sources are labelled MSB and LSB4 to LSB0, and their respective output currents are labelled Im and I4 to I0, to facilitate understanding in relation to implementing the DAC circuitry 101 of FIG. 4. In this regard, the OCS 301 may be considered representative of a segment from the segment group MSB, the OCS 302 may be considered representative of a segment from the segment group LSB4, the OCS 303 may be considered representative of a segment from the segment group LSB3, the OCS 304 may be considered representative of a segment from the segment group LSB2, the OCS 305 may be considered representative of a segment from the segment group LSB1, and the OCS 306 may be considered representative of a segment from the segment group LSB0, However, in principle the output current sources OCS could be other current sources in other arrangements, not necessarily related the segmented DAC circuitry 101.

Figure 6:
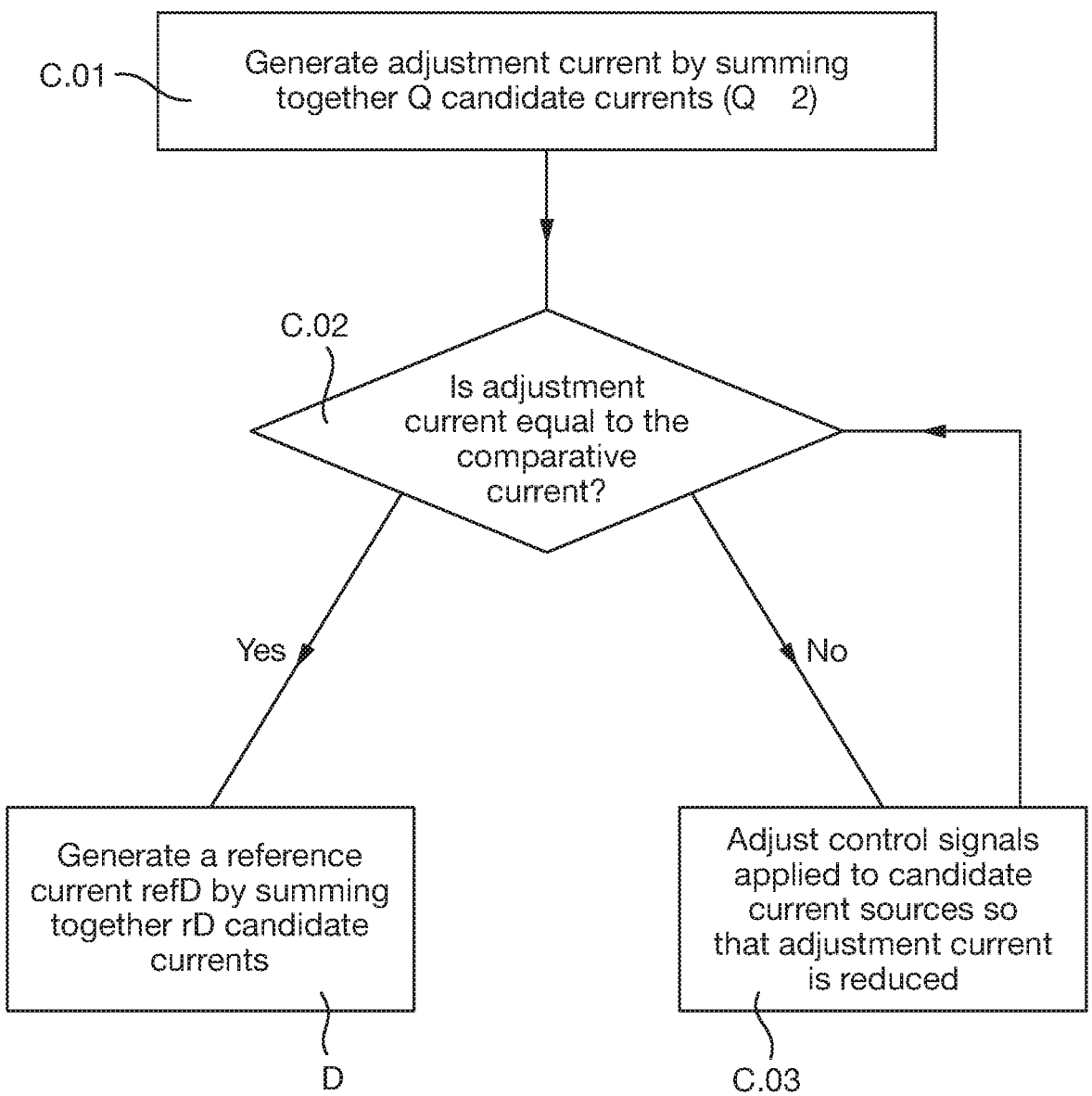
FIG. 6 is a flow diagram illustrating steps of a current generation method, performed by the current-generation circuitry of FIG. 5.

FIG. 6 is a flow diagram illustrating steps of a method of generating currents using for example the current-generation circuitry 300 (current calibration circuitry 10) of FIG. 5, and comprising steps C and D. As apparent from FIG. 6, steps C and D are carried out in alphabetical order.

In step C (comprising steps C.01 to C.03), an adjustment current is generated by summing together a number of the candidate currents CC. At least the candidate current sources CCS which generate that adjustment current are then calibrated (or adjusted) by comparing that adjustment current to a comparative current and adjusting or controlling control signals applied to those candidate current sources CCS together (i.e. at the same time and/or in the same way) to reduce their candidate currents CC together until that adjustment current and the comparative current are brought into a defined relationship. Controlling the control signals together may for example include controlling them simultaneously in the same way and also e.g. one-by-one in the same way.

In step C.01, the adjustment current is generated by summing together Q candidate currents (Q≥2). That is, a number (Q) of the candidate currents CC1 to CCq are summed together (by connecting together respective current paths carrying those candidate currents) to generate the adjustment current.

In step C.02, it is determined whether or not the adjustment current generated in step C.01 is (substantially) equal to the comparative current (the defined relationship here being taken for ease of understanding to be that the adjustment current is substantially equal to the comparative current). The comparative current may be taken to be one of the output currents Im to I0 output from one of the output current sources 301 to 306. In a particular example the comparative current may be taken to be the output current Im output from output current source 301. The comparative current may be taken to be another current output from other circuitry, for example the calibration current Ic output from the calibration current source 20 (or a similar current output from corresponding circuitry).

The comparison is performed by comparator circuitry 30 shown in FIG. 5. That is, comparator circuitry 30 receives as its inputs the adjustment current generated in step C.01 and the comparative current, and outputs a signal COM indicative of the difference between the adjustment current and the comparative current. The adjustment current being (substantially) equal to the comparative current may be taken to mean that these two currents are equal to within a threshold difference—that is, that the difference between these two current is less than a threshold difference. The relationship equal or substantially equal will be understood accordingly herein.

If it is determined in step C.02 that the adjustment current is not equal to the reference current then the method proceeds to step C.03. It is an assumption here that in this case the adjustment current is larger than the comparative current.

In step C.03, at least the control signals applied to the candidate current sources used to generate the adjustment current are adjusted or controlled together to reduce their candidate currents (in magnitude) together so that the adjustment current is reduced. That is, the control signals applied to the candidate current sources used to generate the adjustment current are adjusted or controlled together so that when those candidate current sources are used again to generate an adjustment current (by summing together the corresponding candidate currents), the resulting adjustment current will be reduced (in magnitude) compared to the adjustment current generated before the control signals were adjusted. Further, other control signals that are applied to candidate current sources other than those used to generate the adjustment current may also be adjusted or controlled to reduce their candidate currents (in the same way) so that those candidate current sources are also (eventually) calibrated in the same way as the candidate current sources used to generate the adjustment current. For ease of understanding in relation to the example implementation described later, it may be assumed that it is the control signal GV which is adjusted or controlled here, thus controlling multiple candidate current sources together. As mentioned above, comparator circuitry 30 may output as COM the control signals applied to the candidate current sources (that are to be adjusted or controlled). There could be other circuitry (control circuitry) which receives the signal COM and outputs the control signals applied to the candidate current sources (to be adjusted) based on the received signal COM.

Step C.03 is repeated as indicated until it is determined in step C.02 that the adjustment current is equal to the comparative current.

If it is determined in step C.02 that the adjustment current is substantially equal to the comparative current then the method proceeds to step D. In step D, a reference current refD is generated by summing together rD candidate currents generated by the candidate current sources calibrated in steps C.02 and C03. That is, a number (rD, being a positive integer) of the candidate currents CC1 to CCq generated by the candidate current sources that were calibrated in step C are summed together (by connecting together respective current paths carrying those candidate currents) to generate a reference current refD. rD may be smaller than Q so that the reference current refD is smaller (in magnitude) than the adjustment current generated in step C.01 and/or the comparative current employed in step C.01, rD may be equal to 1, in which case the reference current refD is generated by selecting one of the candidate currents generated by the candidate current sources calibrated in steps C.02 and C.03.

The method illustrated in FIG. 6 thereby generates a reference current that is a given fraction of the comparative current, defined by a ratio of one integer to another (e.g. X:Y, where X and Y are positive integers). For example, if the adjustment current is generated by summing together 5 of the candidate currents, at least those 5 candidate currents are calibrated in steps C.02 and C.03. Then in step D, a reference current may be generated by summing together for example 4 of those candidate currents that have been calibrated in steps C.02 and C.03. The resulting reference current in this example will therefore be ⅘ of the comparative current (provided the candidate currents are (substantially) equal to one another).

Of course, Q and rD may be chosen differently to generate a reference current refD which is a different fraction of the comparative current. For example, Q may be 4 and rD may be 1, in which case the resulting reference current will therefore be ¼ of the comparative current (provided the candidate currents are (substantially) equal to one another). It will become apparent, looking back to FIG. 4 for example, that this particular fraction ¼ is useful where each successive output current I4 to I0 is ¼ of the preceding output current in the order I4 to I0. Recall that the output currents Im and I4 to I0 output from segments of the respective segment groups MSB and LSB4 to LSB0 satisfy Im=4*I4=16*I3=64*I2=256*I1=1024*I0, so that the output current I0 is 1/1024 that of the output current Im.

Figure 7:
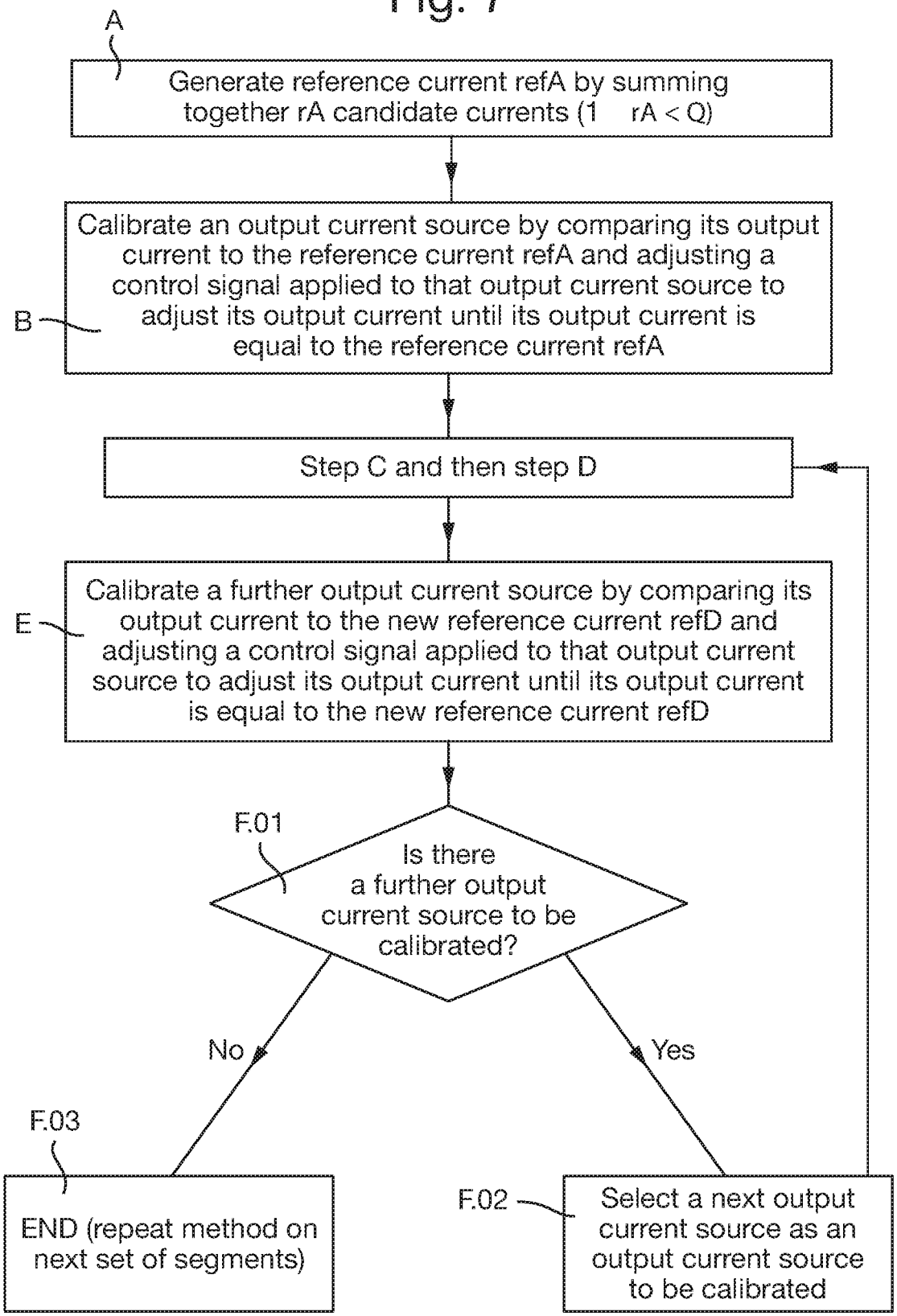
FIG. 7 is a flow diagram illustrating steps of a current generation method, performed by the current-generation circuitry of FIG. 5.

FIG. 7 is a flow diagram illustrating a current generation method comprising steps A to F, of which steps C and D correspond to those of FIG. 6, and using for example the current-generation circuitry 300 (current calibration circuitry 10) of FIG. 5.

As apparent from FIG. 7, steps A to F are carried out in the alphabetical order A to F such that steps A and B precede step C.

In step A, a reference current refA is generated by summing together rA candidate currents. That is, a number (rA, being a positive integer where rA≥1) of the candidate currents CC1 to CCq are summed together (by connecting together respective current paths carrying those candidate currents) to generate a reference current refA. rA may be equal to 1, in which case the reference current refA is generated by selecting one of the candidate currents CC1 to CCq.

In step B, an output current source OCS is calibrated by comparing its output current to the reference current refA and adjusting or controlling a control signal applied to that output current source to adjust its output current until those currents are brought into a defined relationship. That is, an output current source, for example the output current source 302, is calibrated by comparing its output current I4 to the reference current refA and adjusting or controlling a control signal applied to the output current source 302 to adjust its output current I4 until its output current I4 is (substantially) equal to the reference current refA (the defined relationship here being taken for ease of understanding to be that the output current I4 is substantially equal to the reference current refA).

It will be appreciated that such adjusting until the defined relationship is achieved in step B may be performed with a repeating loop of operations equivalent to steps C.02 and C.03. Similar considerations apply to step E described below.

Steps C and then D of FIG. 6 are then implemented. The reference current refD may in this case be referred to as a "new" reference current refD (since it follows the generation of reference current refA). Assuming the mutually equal relationship between the candidate currents for continued ease of understanding, the number Q of candidate currents summed together to generate the adjustment current in the step C is more than the number rA of candidate currents summed together to generate the reference current refA in the step A, so that the adjustment current generated in the step C is larger (in magnitude) than the reference current refA generated in the step A. That is, 1≤rA<Q.

In step E, a further one of the output current sources 301 to 306 is calibrated by comparing its output current to the new reference current refD and adjusting or controlling a control signal applied to that output current source to adjust its output current until those currents are brought into a defined relationship. That is, another output current source OCS (other than the output current source calibrated in the step B), for example the output current source 303, is calibrated by comparing its output current I3 to the new reference current refD and adjusting or controlling a control signal applied to the output current source 303 to adjust its output current I3 until its output current I3 is (substantially) equal to the new reference current refD (the defined relationship here being taken for ease of understanding to be that the output current I3 is equal to the new reference current refD).

Here it will be appreciated that if the comparative current in step C is I4=refA (i.e. the output current of the output current source calibrated in the preceding step B), Q is 4 and rD is 1, then the output current source 303 will be calibrated until the output current I3 is (I4)/4 in line with FIG. 4.

As already suggested, the comparison of the output current with the reference current refA in step B, and also the comparison of the other output current with the reference current refD in step C, is performed by comparator circuitry 30 shown in FIG. 5. That is, comparator circuitry 30 receives as its inputs for example the output current I4 and the reference current refA and outputs a signal COM indicative of the difference between the output current I4 and the reference current refA. The output current (for example I4) being substantially equal to the reference current refA may be taken to mean that these two currents are equal to within a threshold difference—that is, that the difference between these two current is less than a threshold difference.

The adjusting or controlling of a control signal applied to an output current source is described in more detail below. As mentioned above, comparator circuitry 30 may output as COM the control signal applied to the output current source (to be adjusted). There could be other circuitry which receives the signal COM and outputs the control signal applied to the output current source (to be adjusted) based on the received signal COM.

After the step E the method proceeds to step F (comprising steps F.01, F.02 and F.03).

In step F.01, it is determined whether or not there is a further output current source OCS to be calibrated. This determination is described in more detail below. If it is determined that there is a further output current source to be calibrated, the method proceeds to step F.02. In the step F.02, a further output current source is selected as an output current source to be calibrated and the method returns to the step C. If is determined in the step F.01 that there is no further output current source to be calibrated then the method proceeds to step F.03. In the step F.03, the method ends.

The determination in the step F.01 may depend on which output current sources are to be calibrated, and may be carried out by circuitry (e.g. control circuitry of the current-generation circuitry 300) not shown in FIG. 5.

One possibility, with reference to the segmented DAC circuitry 100 shown in FIG. 2, is that a single segment of each segment group may be calibrated (i.e. the output current source from that segment may be calibrated) in turn from e.g. the segment group SG1 to the segment group SGL. A segment set may be taken to comprise a single segment of each group. Then, at step F.03, after each segment in a segment set has been calibrated the method may return to the step A starting with a segment of a further such segment set. That is, the method may be implemented again by calibrating each segment in a further segment set (for example starting with a segment from the segment group SG1 and calibrating a segment from the following segment groups in turn ending with a segment from the segment group SGL). The method steps A to F may be repeated until all the segments have been calibrated.

Another possibility, useful e.g. if the segment groups in the segmented DAC circuitry 100 do not each comprise the same number of segments (and for other reasons), is that the relevant method steps may be repeated (e.g. the step B or the step E) when calibrating one or more of the segments so that all segments of the segment group concerned are calibrated one after the other. For example, even if the segment groups in the segmented DAC circuitry 100 each comprise the same number of segments, more than one segment from each segment group (such as all of the segments from each segment group) may be calibrated during a single implementation of the steps A to F. That is, particular method steps may be repeated (e.g. the step B or the step E) so that more than one segment is calibrated using a particular reference current (refA or refD).

In other words, when step A is calibrating a particular output current source (corresponding to a segment) of a particular segment group using its reference current refA, it may continue after calibrating that output current source to calibrate the other output current sources of that segment group before the method proceeds to step C. Similarly, when a step E is calibrating a particular output current source (corresponding to a segment) of a particular segment group using a reference current refD, it may continue after calibrating that output current source to calibrate the other output current sources of that segment group before the method proceeds to step F. Steps F.01 may then correspond to checking whether there are output current sources (corresponding to segments) of other segments groups that are yet to be calibrated, in which case returning to step C via step F.02, with the method ending at step F.03 when there are no output current sources (corresponding to segments) of other segments groups that are yet to be calibrated.

There may be more than one instance of the calibration circuitry 10 and more than one segment set may be calibrated simultaneously.

In the method comprising the steps A to F, the comparative current of step C may be taken to be the output current of the output current source (or one of the output current sources) calibrated in the preceding step B or E, as suggested previously. For example, referring to the calibration circuitry in FIG. 5, if the output current source 302 is calibrated in the step B, then the comparative current employed in the step C may be the output current I4, so that, depending on the number Q of candidate currents summed together to generate the adjustment current and the number rD of candidate currents summed together to generate the reference current refD, the output current source calibrated in the step E (for example the output current source 303) will be calibrated so that its output current I3 is a given fraction of the (calibrated) output current I4, that fraction being defined by two integers. That is, the (calibrated) output currents I4 and I3 will satisfy I3=(rD/Q)*I4, where rD and Q are integers as already mentioned. Again, if Q is 4 and rD is 1, then the output current source 303 will be calibrated until the output current I3 is (I4)/4 in line with FIG. 4.

Each of the numbers Q, rA and rD could be the same on each iteration of the steps A to F or they could be different on each such iteration. The numbers rD and rA could be the same as each other or they could be different.

In a particular implementation the method described above in relation to FIG. 7 may comprise (although not shown in FIG. 7) an additional method step X preceding the step A. In the step X, each of the candidate current sources CCS1 to CCSq is calibrated by comparing its candidate current CC to a calibration current Ic and controlling or adjusting a control signal applied to that candidate current source until those currents are brought into a defined relationship. Taking the candidate current source CCS1 as a representative example, the candidate current source CCS1 is calibrated by comparing its candidate current CC1 to the calibration current Ic and adjusting or controlling a control signal applied to the candidate current source CCS1 to adjust its candidate current CC1 until its candidate current CC1 is (substantially) equal to the calibration current (the defined relationship here being taken to be that the candidate current CC1 is substantially equal to the calibration current Ic).

The calibration current is the same for each candidate current source so that after step X has been implemented all of the candidate currents CC1 to CCq output by the candidate current sources CCS1 to CCSq, respectively, are (substantially) equal to one another. In a particular example the calibration current is the current Ic generated by the calibration current source 20.

In a further particular implementation the method described above comprising the step X may comprise (although not shown in FIG. 7) additional method steps Y and Z. The method steps X, Y and Z may be performed in alphabetical order, but prior to step A.

In the method step Y, following the step X and before the step A, a reference current refY is generated by summing together a number rY of the candidate currents, the number rY being larger than the number rA of candidate currents summed together to generate the reference current refA in the step A. That is, a number (rY being an integer, where rY>1) of the candidate currents CC1 to CCq are summed together (by connecting together respective current paths carrying those candidate currents) to generate a reference current refY.

In the step Z, following step Y and before the step A, a further one of the output current sources 301 to 306 is calibrated by comparing its output current to the reference current generated refY in the step Y and adjusting or controlling a control signal applied to that output current source to adjust its output current until those currents are brought into a defined relationship. That is, another output current source (other than the output current sources to be calibrated in the steps B and E), for example the output current source 301, is calibrated by comparing its output current Im to the reference current refY and adjusting or controlling a control signal applied to the output current source 301 to adjust its output current Im (as described in relation to the steps B and E) until its output current Im is (substantially) equal to the reference current refY (the defined relationship here being taken to be that the output current Im is equal to the reference current refY).

Here it will be appreciated that if rY is 4 and rA is 1 then the output currents I4 and Im will be such that I4 is (Im)/4 in line with FIG. 4.

The steps X, Y and Z may be considered to be outside of the repeated method—i.e. after the step F.02 in FIG. 7 the method returns to the step A (even in the particular implementations in which the step X or the steps X, Y and Z are included in the method). However, in a preferred implementation, step X or C (with a suitable comparative current) is returned to in order to return the candidate current sources to configurations where the candidate currents are suitable for calibrating the more significant segments.

The method steps B, E and Z could use the same comparator circuitry 30 or different comparator (comparison) circuitry could be used for one or more of the steps. The same calibration circuitry 10 could be used on each repetition of the method steps A to E. or different instances of calibration circuitry 10 could be used.

FIG. 8 is a table illustrating a particular implementation of the method steps X to E carried out using for example the current-generation circuitry 300 (current calibration circuitry 10) of FIG. 5 with the particular segmented DAC circuitry 101 shown in FIG. 4 in mind, as a running example.

In this particular implementation, the output current sources 301 to 306 of the current-generation circuitry 300 may each be taken to be a segment belonging to the relevant segment group (corresponding to the output current source's label, e.g. LSB4) of the segmented DAC circuitry 101. In this case, it is assumed that each segment comprises a single current mirror (for a simplified single-ended example in line with FIG. 4), with the calibration of each segment corresponding to calibrating the current mirror of that segment when it is configured to be ON (so that the input current of the current mirror is the segment current Is). In other arrangements each segment may comprise more than one current mirror, in line with the differential implementation explained in connection with FIGS. 2, 3A and 3B (in which case it will be apparent that the current mirrors of each segment can be calibrated by configuring the segment to be ON and then OFF, respectively, so that when calibrated their input current is the segment current Is).

The output current source 301 is thus taken to be a segment of the segment group labelled MSB, the output current source 302 is taken to be a segment of the segment group labelled LSB4, the output current source 303 is taken to be a segment of the segment group labelled LSB3, the output current source 304 is taken to be a segment of the segment group labelled LSB2, the output current source 305 is taken to be a segment of the segment group labelled LSB1 and the output current source 306 is taken to be a segment of the segment group labelled LSB0.

In the particular implementation of FIG. 8, the calibration current is the current Ic output from the calibration current source 20 and is given the value $(¼)*Imsb$, where Imsb is the desired output current from current mirrors in the segments of the segment group MSB. Further, the segment current Is, being the segment current generated in each segment as described above in relation to FIGS. 3A and 4, is designed to be $(½)*Imsb$. Therefore, the segment current Is is designed to be $2*Ic$. This is of course one particular implementation, and is considered advantageous from a circuit design point of view.

It will be understood that the current mirrors of the segments are designed to "nominally" provide the output currents (Im, I4, I3, I2, I1, I0) with the desired values relative to Imsb based on the input segment currents Is (i.e. with an expected degree of inaccuracy e.g. based on device mismatch within and across process). It will further become apparent that the method serves to calibrate the current mirrors to overcome (or reduce or mitigate) the effect of such mismatches and thus accurately achieve the desired output current values (leading to the desired accurate DAC circuitry 101).

In the particular implementation of FIG. 8, only the candidate current sources CCS1 to CCS4 are used, and as such only these need be provided. Of course, in other implementations there may be more candidate current sources CCS. Although here the same four candidate current sources are used across the method steps for convenience, in other implementations the same current sources need not be used for the generation of one or more of the reference currents refA, refD and refY and the adjustment current.

The entries in column "STEP(S)" in FIG. 8 show to which step or steps of the methods described above each row corresponds. The column "TIME" shows the relative time step at which that step is carried out or those steps are carried out, with time steps t1 to t11 occurring one after the other in that order (but not necessarily being equally spaced in time). The column "R1" shows which current is applied at the input R1 of the comparator circuitry 30 at each time step. The column "R2" shows which current is applied at the input R2 of the comparator circuitry 30 at each time step. The column "ADJUST" shows which control signal or control signals are controlled or adjusted at each time step, and the column "MAINTATAIN" indicates which control signal or control signals are maintained at each time step.

At time step t1 (comprising sub time steps t1.1, t1.2, t1.3, t1.4) each candidate current source CCS1 to CCS4 is calibrated by comparing its candidate current to the calibration current Ic and controlling or adjusting a control signal applied to that candidate current source until those currents are brought into a defined relationship—i.e. the step X is carried out. That is, the candidate current source CCS1 is calibrated by comparing its candidate current CC1 to the calibration current Ic using comparator circuitry 30 and controlling or adjusting the control signal B1 until the candidate current CC1 and the calibration current Ic are equal to each other. This calibration process is repeated for the candidate current sources CCS2 to CCS4, controlling the control signals B2 to B4, respectively. Thus, the step X is shown in FIG. 8 as occurring at the time t1.

The calibration of each candidate current source CCS1 to CCS4 may be carried out simultaneously (in some arrangements) or separately (as shown, by virtue of sub time steps t1.1, t1.2, t1.3, t1.4). The calibration of two or more of the candidate current sources may be carried out one after the other. After the time step t1, each of the candidate currents CC1 to CC4 has the value (¼)*Imsb in the particular implementation. For consistency with a detailed circuit implementation described later, where GV is separate from each of B1 to B4, this control may be performed whilst maintaining GV unchanged (as indicated in FIG. 8).

At time step t2 steps Y and Z are carried out. All of the candidate currents CC1 to CC4 are applied together to the input R1 (i.e. they are summed to generate a reference current refY which is applied to the input R1). The output current Im output from the current mirror (the MSB mirror) of the MSB segment as the output current source 301 is applied (connected) to the input R2. Those two currents are thereby compared and the control signal B-MSB applied to the MSB current mirror concerned is controlled or adjusted until those two currents are equal—i.e. the MSB current mirror concerned is calibrated so that its output current Im is CC1+CC2+CC3+CC4, or Imsb. The control of current mirrors in this way is described in more detail below. It is assumed that the MSB current mirror is designed to nominally output Imsb, such that the control of the control signal B-MSB serves to calibrate out e.g. mismatch or other process-related inaccuracies. The B-MSB control signal is then maintained (to retain the effect of the calibration, and similar considerations apply for the other segments).

The operations at time step t2 could be continued (effectively with further steps Z) to calibrate further segments of the MSB segment group using the same reference current refY of step Y, such that all of the segments of the MSB segment group have an output current Im equal to Imsb.

At time step t3 steps A and B are carried out. One of the candidate currents of the candidate current sources CCS1 to CCS4 is applied to the input R1 as a reference current refA and the output current I4 output from the current mirror (the LSB4 mirror) of the LSB4 segment as the output current source 302 is applied to the input R2. Those two currents are thereby compared and the control signal B-LSB4 applied to the LSB4 mirror is controlled or adjusted until those two currents are equal—i.e. the LSB4 current mirror is calibrated so that its output current I4 is equal to one of candidate currents CC1 to CC4—i.e. so that the output current I4 is (¼)*Imsb. It is assumed that the LSB4 current mirror is designed to nominally output (¼)*Imsb, such that the control of the control signal B-LSB4 serves to calibrate out e.g. mismatch or other process-related inaccuracies.

The operations at time step t3 could be continued (effectively with further steps B) to calibrate further segments of the LSB4 segment group using the same reference current refA of the preceding step A, such that all of the segments of the LSB4 segment group have an output current I4 equal to (¼)*Imsb.

At time step t4 the step C is carried out. All of the candidate currents CC1 to CC4 are connected together and applied to the input R1 (i.e. they are summed to generate an adjustment current which is connected to the input R1). The calibrated output current I4 output from the current mirror of the LSB4 segment (the LSB4 mirror) as the output current source 302 is applied to the input R2 (although another calibrated output current I4 could be used instead of course). Those two currents are thereby compared and the control signal GV applied in common to each of the candidate current sources CCS1 to CCS4 is controlled or adjusted to reduce the candidate currents together until those two currents (the adjustment current CC1+CC2+CC3+CC4 and the output current I4) are equal. Generically, ignoring the actual form of the control signals, this could be considered equivalent to controlling B1, B2, B3, B4 together in the same way. However, focus will be placed on controlling GV, whilst maintaining each of B1, B2, B3, B4 unchanged) for ease of understanding in relation to the detailed circuit implementation described later, where GV is separate from each of B1 to B4. In any event, the candidate current sources CCS1 to CCS4 are calibrated (or, the candidate currents CC1 to CC4 are adjusted) in the same way so that the sum of the candidate currents CC1 to CC4 is equal to the calibrated I4—i.e. so that the sum of the candidate currents CC1 to CC4 is equal to (¼)*Imsb (since the LSB4 mirror concerned was calibrated at time step t3).

At time step t5 the steps D and E are carried out. One of the candidate currents of the candidate current sources CCS1 to CCS4 is connected to the input R1 as a reference current refD and the output current I3 output from the current mirror (the LSB3 mirror) of the LSB3 segment as the output current source 303 is connected to the input R2. Those two currents are thereby compared and the control signal B-LSB3 applied to the LSB3 mirror is controlled or adjusted until those two currents are equal—i.e. the LSB3 current mirror is calibrated so that its output current I3 is equal to one of CC1 to CC4—i.e. so that the output current I3 is (¼)*(¼)*Imsb= (1/16)*Imsb (since the calibration currents CC were calibrated at the time step t1 to be equal to one another and then adjusted at the time step t4). It is assumed that the LSB3 current mirror is designed to nominally output (1/16)*Imsb, such that the control of the control signal B-LSB3 serves to calibrate out e.g. mismatch or other process-related inaccuracies.

The operations at time step t5 could be continued (effectively with further steps E) to calibrate further segments of the LSB3 segment group using the same reference current refD of the preceding step D, such that all of the segments of the LSB3 segment group have an output current I3 equal to (1/16)*Imsb.

Since there is still at least a further output current source to be calibrated (i.e. it is determined in the step F (not shown) that there is a further output current source corresponding to a segment of a further segment group to be calibrated), the steps C to E are repeated.

At time step t6 the step C is carried out using as the comparative current an output current I3 (output from an LSB3 current mirror which was calibrated at the time step t5). All of the candidate currents CC1 to CC4 are connected together and applied to the input R1 (i.e. they are summed to generate an adjustment current which is connected to the input R1). The calibrated output current I3 output from the current mirror of the LSB3 segment (the LSB3 mirror) as the output current source 303 is applied to the input R2 (although another calibrated output current I3 could be used instead of course). The candidate current sources CCS1 to CCS4 are then calibrated (or, the candidate currents CC1 to CC4 are adjusted) in the same way so that the sum of the candidate currents CC1 to CC4 is equal to I3—i.e. so that the sum of the candidate currents CC1 to CC4 is equal to ($1/16$)*Imsb (since the LSB3 mirror was calibrated at time step t5). For consistency with the detailed circuit implementation described later, this control may be performed by controlling GV whilst maintaining each of B1, B2, B3, B4 unchanged.

At a time step t7 the steps D and E are carried out. One of the candidate currents of the candidate current sources CCS1 to CCS4 is connected to the input R1 as a new reference current refD and the output current I2 output from the current mirror (the LSB2 mirror) of the LSB3 segment as the output current source 304 is connected to the input R2. Those two currents are thereby compared and the control signal B-LSB2 applied to the LSB2 mirror is controlled or adjusted until those two currents are equal—i.e. the LSB2 current mirror is calibrated so that its output current I2 is equal to one of CC1 to CC4—i.e. so that the output current I2 is ($1/4$)*($1/16$)*Imsb=($1/64$)*Imsb (since the calibration currents CC were calibrated at the time step t1 to be equal to one another and then adjusted at the time steps t4 and t6). It is assumed that the LSB2 current mirror is designed to nominally output ($1/64$)*Imsb, such that the control of the control signal B-LSB2 serves to calibrate out e.g. mismatch or other process-related inaccuracies.

The operations at time step t7 could be continued (effectively with further steps E) to calibrate further segments of the LSB2 segment group using the same reference current refD of the preceding step D, such that all of the segments of the LSB2 segment group have an output current I2 equal to ($1/64$)*Imsb.

Since there is still at least a further output current source to be calibrated (i.e. it is determined in the step F (not shown) that there is a further output current source corresponding to a segment of a further segment group to be calibrated), the steps C to E are repeated as shown in FIG. 8 in steps t8 and t9 for the LSB1 segments and then in steps t10 and 11 for the LSB0 segments, following the methodology described above. This leads to the LSB1 current mirror (of each LSB1 segment) calibrated so that its output current I1 is equal to ($1/256$)*Imsb and the LSB0 current mirror (of each LSB0 segment) calibrated so that its output current I0 is equal to ($1/1024$)*Imsb.

It is assumed that the LSB1 current mirrors are designed to nominally output ($1/256$)*Imsb, such that the control of the control signals B-LSB1 serves to calibrate out e.g. mismatch or other process-related inaccuracies. It is similarly assumed that the LSB0 current mirrors are designed to nominally output ($1/1024$)*Imsb, such that the control of the control signals B-LSB0 serves to calibrate out e.g. mismatch or other process-related inaccuracies.

Since there is then no further output current source to be calibrated after the time step t11 (i.e. it is determined in the step F (not shown) that there is no further output current source to be calibrated) the method ends. If it were that only one segment of each segment group was calibrated in time steps t1 to t11, the steps X, Y, Z and A to F could be repeated (in corresponding steps t12 to t22) for a further segment set for example.

Steps corresponding to the step X can be added between e.g. steps Z and A, and/or steps C and D, to ensure that after adjustment the candidate currents are still equal to one another (but using a suitable calibration current—for example a calibrated output current).

It will be appreciated that the segment current may be chosen differently for other arrangements of segmented DAC circuitry. For example the segment current could be chosen to be the desired output from the current mirrors of the MSB segments, so that in the step X each candidate current source could be calibrated so that its candidate current is equal to the desired output from the current mirrors of the MSB segments, and then in the steps A and B the MSB current mirror could be calibrated by adjusting or controlling a control signal applied to that current mirror so that the output current from the MSB current mirror is equal to each candidate current, i.e. the desired MSB output. That is, the steps Y and Z in this case are not required.

It will of course be appreciated that the above method can be adjusted for other arrangements of segmented DAC circuitry that require different current mirror ratios. For example, different numbers of candidate currents can be summed to generate the reference currents and the adjustment currents.

Although an output current was taken to be the comparative current in the above description with reference to FIG. 8, another current may be taken to be the comparative current. An advantage of using the output current output from one of the output current sources of the segment group that was most recently (i.e. previously) calibrated is as follows.

As an example, the DAC segmented circuitry 101 requires the output current from segments of each successive segment group to be one quarter of that of the preceding group in the order of MSB to LSB0. If the reference current refA is not in fact the desired output current to be output from the output current source Im (for example due to an error in any of the candidate current sources CCS1 to CCS4 or in the calibration current source 20) then using the output current output from the most calibrated output current source has the advantage that the ratio between successive output currents is the same despite this error. Any initial error in the current Ic generated by the calibration current source would only manifest itself as a DC offset. Further, any error related to a comparator performing the comparisons can be reduced by increasing the time available for performing comparisons (as will be more apparent later).

Further, although not necessary for the functioning of the arrangements disclosed herein, there is an advantage associated with using the candidate current sources to generate the reference and adjustment currents. For example, consider the segmented DAC circuitry 101 and the implementation described with reference to FIG. 8. If the same (four) candidate current sources CCS1 to CCS4 are used each time to generate the adjustment currents, and the same (one) candidate current source (e.g. the candidate current source CCS1) is used each time to generate the reference currents, then even if there is an error in the candidate current sources e.g. so that the candidate currents are not equal to each other, the ratio between successive output currents is the same despite this error. This is because the error affects the calibration of each output current source in the same way.

The above two advantages may be important for circuitry in which the current-generation circuitry 300 is incorporated where the value of the output currents are relative rather than absolute (i.e. their values compared to one or more other output currents are more important than their values compared to an independent and separate current).

Looking back to FIG. 8, it will incidentally be noted that over time step t4, for example, the step C is used to adjust the candidate currents so that they are reduced by a factor of 4. This is because at time step t3, CC1 is used to calibrate I4, and then at time step t4 the current combination CC1+CC2+CC3+CC4 (which will be equal to 4*I4, assuming mutually-equal candidate currents) is adjusted until it is equal to I4, in which case each of CC1 to CC4 will be equal to I4. Of course, the reverse case could also be implemented, in which the candidate currents are adjusted so that they are increased by a factor such as 4. For example, if at one step a current Ismall is calibrated using the current combination CC1+CC2+CC3+CC4, then in a subsequent step the candidate current CC1 could be adjusted until it is equal to Ismall (adjusting the other candidate currents at the same time in the same way). A new current Ibig could then be calibrated using the new current combination CC1+CC2+CC3+CC4. The present disclosure will be understood accordingly.

Figure 9:
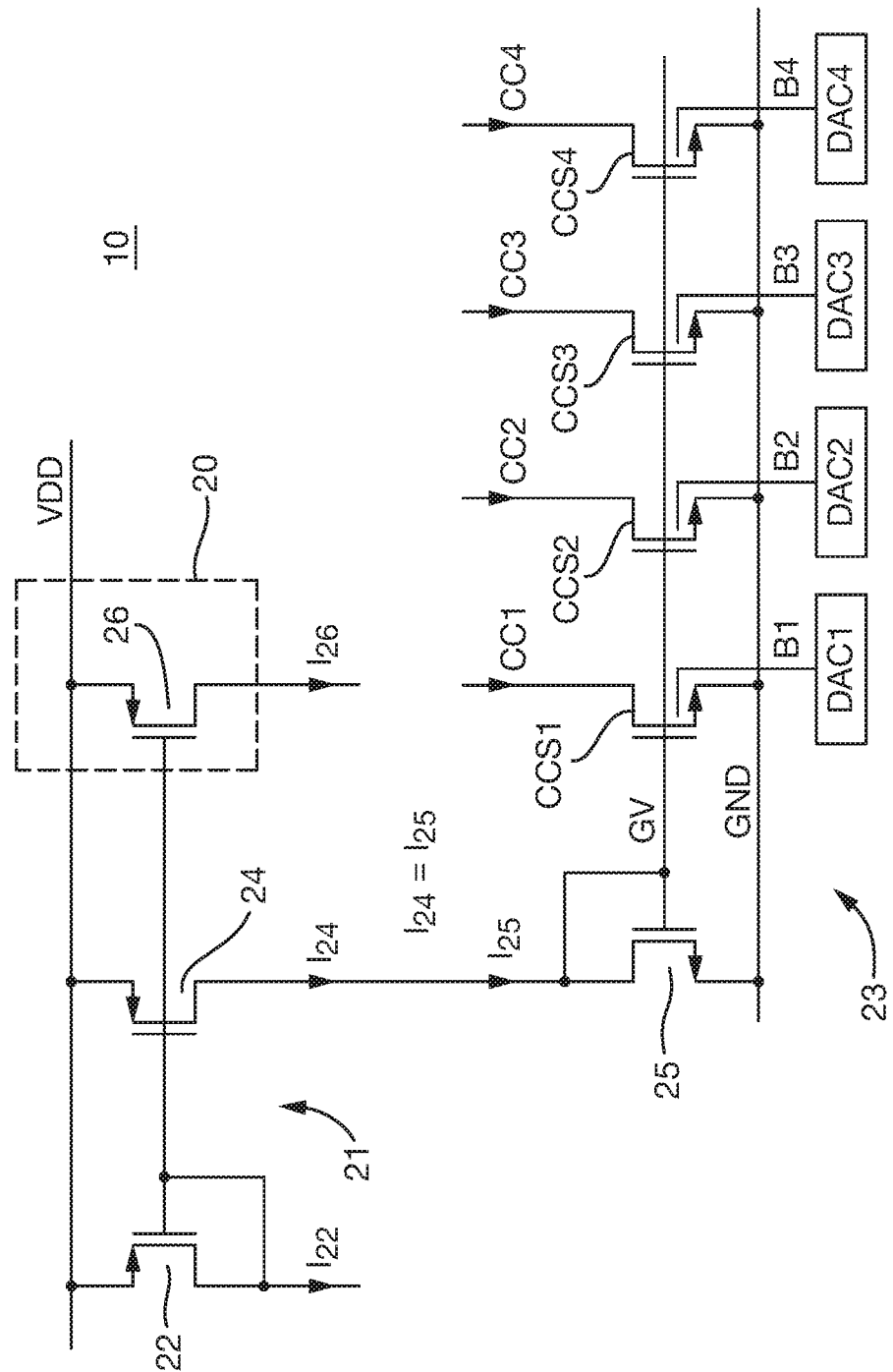
FIG. 9 is a schematic diagram of a particular implementation of parts of the FIG. 5 calibration circuitry.

FIG. 9 is a schematic diagram of a particular implementation of parts of the calibration circuitry 10 of FIG. 5, in particular including the calibration current source 20 and the candidate current sources CCS1 to CCS4.

The parts of the calibration circuitry 10 in the FIG. 9 implementation comprise field-effect transistors 22, 24 and 26 (PMOS MOSFETs), and field-effect transistors 25, CCS1, CCS2, CCS3 and CCS4 (NMOS MOSFETs). Thus, in this implementation, the candidate currents sources CCS1 to CCS4 are implemented as NMOS MOSFETs. Also provided are digital-to-analogue converters DAC1 to DAC4, provided for the candidate currents sources CCS1 to CCS4, respectively. DAC1 to DAC4 are sub-DACs for internal control within the overall current-generation circuitry 300 (implementing the DAC circuitry 101).

The PMOS transistors 22, 24 and 26 are connected together so as to form a current mirror 21. In detail, the source terminals of the transistors 22, 24, 26 are each connected to VDD, and their gate terminals are connected together. Further, the gate and source terminals of the transistor 22 are connected together so that that transistor is diode-connected. The transistors 22, 24 and 26 carry currents $I_{22}$, $I_{24}$ and $I_{26}$, respectively, and the currents $I_{24}$ and $I_{26}$ are dependent on the current $I_{22}$ due to the current mirroring.

Similarly, the NMOS transistors 25 and CCS1 to CCS4 are connected together so as to form a current mirror 23. In detail, the source terminals of the NMOS transistors 25 and CCS1 to CCS4 are each connected to GND (ground), and their gate terminals are connected together. Further, the gate and source terminals of the transistor 25 are connected together so that that transistor is diode-connected. The transistors 25, CCS1 to CCS4 carry currents $I_{25}$ and CC1 to CC4, respectively, and the currents CC1 to CC4 are dependent on the current $I_{25}$ due to the current mirroring.

It will be appreciated that currents $I_{24}$ and $I_{25}$ are equal and control the gate voltage of the transistor 25 (and the transistors CCS1 to CCS4), which gate voltage corresponds to the control signal GV. The transistors CCS1 to CCS4 are also controlled via DAC1, DAC2, DAC3 and DAC4, respectively. In particular, DAC1 to DAC4 are configured to output control signals B1 to B4, respectively, to control the bulk voltages of the transistors (the candidate current sources) CCS1 to CCS4, respectively.

In the particular implementation described with reference to FIG. 8, based on the arrangement of the current mirror 21, the current $I_{22}$ flowing through transistor 22 is initially controlled so that the currents $I_{24}$, $I_{25}$ and $I_{26}$ equal the calibration current Ic, and as such the transistor 26 may be equated with the calibration current source 20. The current mirror 23 is also configured such that the candidate currents CC1, CC2, CC3 and CC3 in this case nominally also equal the calibration current Ic (but there may be inaccuracies due e.g. to mismatch between the transistors CCS1 to CCS4).

In that case, as described in connection with FIG. 8 at time step t1, in step X each candidate current source CCS1 to CCS4 is calibrated by comparing its candidate current to the calibration current Ic (i.e. current $I_{26}$) and controlling or adjusting a control signal applied to that candidate current source until those currents are brought into a defined relationship. That is, the candidate current source CCS1 is calibrated by comparing its candidate current CC1 to the calibration current Ic using comparator circuitry 30 and controlling or adjusting the control signal B1 (by controlling DAC1) until the candidate current CC1 and the calibration current Ic are equal to each other. This calibration process is repeated for the candidate current sources CCS2 to CCS4, controlling the control signals B2 to B4 (with DAC2 to DAC4), respectively. During this step, it will be apparent from FIG. 9 that the control signal GV is maintained unchanged (it is controlled ultimately by current $I_{22}$ flowing through transistor 22 which is likewise maintained unchanged). This calibration at time step t1 in effect calibrates out the mismatches between the transistors CCS1 to CCS4, with the digital codes for the DACs DAC1 to DAC4 then creating suitable control signals B1 to B4 to achieve this.

In subsequent steps of the method (see time steps t4, t6, t8 and t10 in FIG. 8) where the control signal GV is changed and the control signals B1 to B4 are maintained unchanged, it will be appreciated that the current $I_{22}$ flowing through transistor 22 could be varied to vary GV, and the digital codes supplied to the DACs DAC1 to DAC4 could be maintained unchanged so that control signals B1 to B4 are maintained unchanged (i.e. so that the mismatches between the transistors CCS1 to CCS4 remain calibrated out). This would change the current $I_{26}$ flowing through transistor 26 (such that it is no longer equal to Ic) but at this stage this current is not needed—transistor 26 indeed could be disconnected at this stage.

Of course, there are other ways to vary the control signal GV. There may also be arrangements where it is useful to have I22 equal to Is, e.g. generated using the FIG. 3A circuitry, with e.g. the current mirror 21 configured accordingly. It will be appreciated that the transistors of the candidate current sources CCS1 to CCS4 may be used with or without the particular implementation shown in FIG. 9. Similarly, the particular implementation of the calibration current source 20 shown in FIG. 9 may be used with or without the transistors of the candidate current sources CCS1 to CCS4. For example, the calibration current source 20 need not be that shown in FIG. 9 and could be any current source.

Similarly, the transistors of the candidate current sources CCS1 to CCS4 may be used with or without the transistor 25. For example, in place of the transistor 25 any variable voltage source could be used to control the control signal GV. In the case in which a variable voltage source is used in place of the transistor 25, the transistors of the candidate current sources CCS1 to CCS4 may be controlled by adjusting the control signal GV directly (or even by controlling their gate voltages individually). For example, at any of the time steps t4, t6, t8 and t10, a voltage GV supplied to the transistors CCS1 to CCS4 could be adjusted in order to adjust (reduce) an adjustment current (generated by summing together a given number of the candidate currents) until the adjustment current and another given current (e.g. an output current) are brought into a defined relationship (e.g. until those two currents are equal) as described earlier. Controlling/adjusting such a variable voltage source and controlling/adjusting control signals applied to candidate current sources together are seen as equivalent for example in the description with reference to FIG. 8.

Incidentally, although the circuitry and the method of calibration described above in connection with FIGS. 8 and 9 is focussed on the specific implementation for generating currents having a ratio 1:4 (e.g. CC1:(CC1+CC2+CC3+CC4), where the candidate currents are mutually equal), in principle with other numbers of candidate current sources other ratios of integers could be achieved. For example, if X>Y and X and Y are both positive integers, then with X candidate current sources a current ratio X:Y could be achieved by combining X candidate currents and then Y candidate currents, assuming that the candidate currents are mutually equal.

Another possibility (looking at FIG. 9) is to connect the candidate current sources (after they have been calibrated) to form a new current mirror which has a current ratio A:B, in this case using A+B candidate current sources where A and B are positive integers. In this case, after the candidate current sources have been calibrated the control signal GV in FIG. 9 could be left floating so that it is controlled by the candidate current sources themselves. Then A of the candidate current sources could be connected in parallel and diode-connected (to form the input side of a current mirror) and the other B of the candidate current sources could be connected in parallel (to form the output side of that current mirror).

Figure 10:
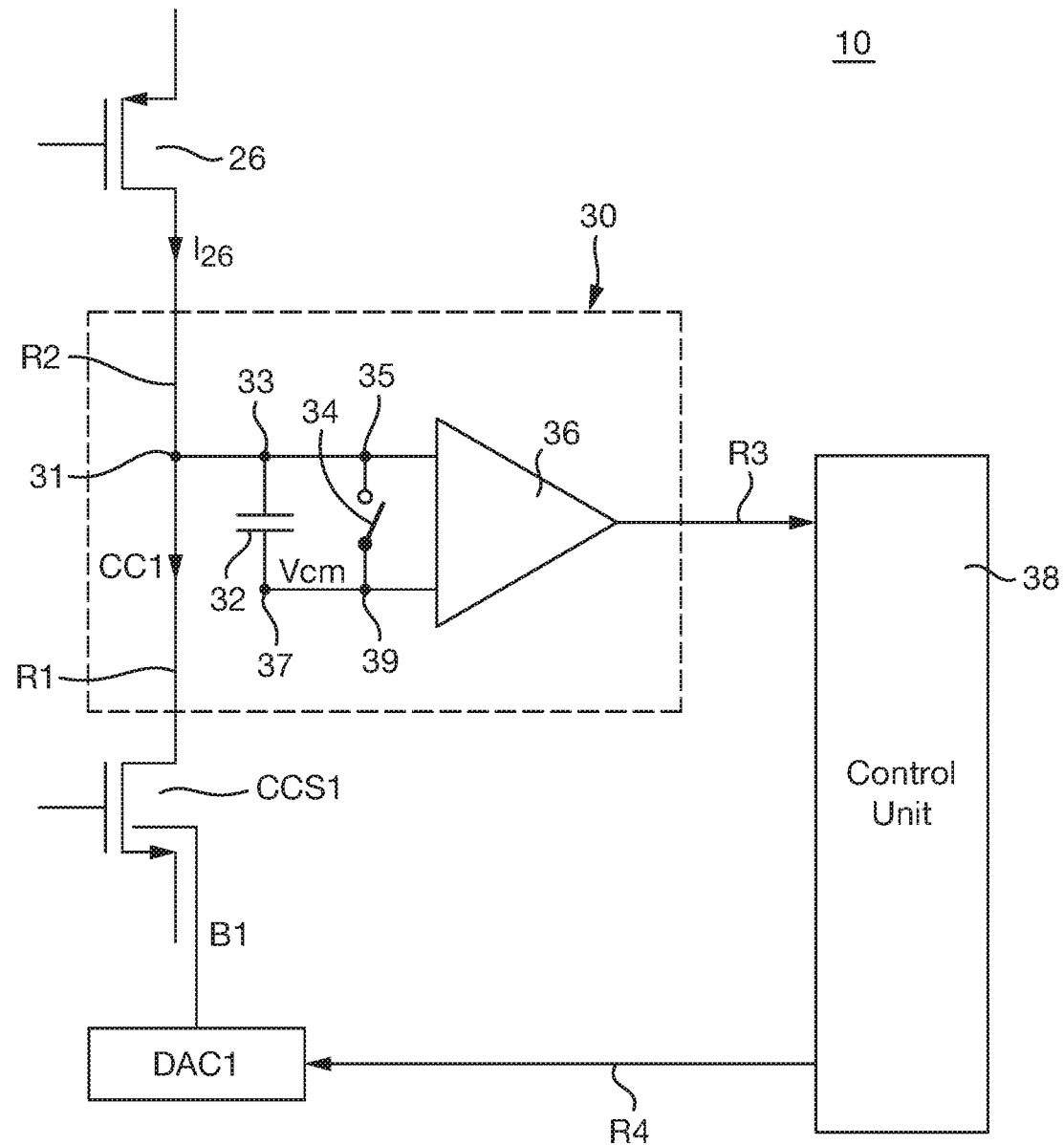
FIG. 10 is a schematic diagram of a particular implementation of other parts of the FIG. 5 calibration circuitry.

FIG. 10 is a schematic diagram of other parts of the present implementation of the calibration circuitry 10 of FIG. 5, in particular the comparator circuitry 30. Certain elements from FIG. 9 are included for ease of understanding. Like reference signs denote like elements.

Comparator circuitry 30 comprises nodes 31, 33, 35, 37 and 39, a capacitor 32, a switch 34, a comparator 36 and the two inputs R1 and R2. The transistor CCS1 (as the candidate current source CCS1) of FIG. 9 is shown as being currently connected to apply the candidate current CC1 at input R1 and the transistor 26 (as the calibration current source 20 of FIG. 9) is shown as being currently connected to apply the current $I_{26}$ at the input R2, in line with part of time step t1 and step X of FIG. 8. However, the connections shown to apply these currents in FIG. 10 will be understood to be controllable (rather than permanent) so that the inputs R1 and R2 may be connected to receive other currents in other steps.

Also shown in FIG. 10 is a control unit 38 connected to receive a signal R3 output from the comparator circuitry 30 and to output a control signal R4 to DAC1. It will be understood that the control unit 38 is also capable of generating other control signals to control at least the signals B1 to B4, GV, B-MSB (per MSB segment), B-LSB4 (per LSB4 segment), B-LSB3 (per LSB3 segment), B-LSB2 (per LSB2 segment), B-LSB1 (per LSB1 segment) and B-LSB0 (per LSB0 segment).

Although shown as separate from comparator circuitry 30, the control unit 38 may be comprised within the comparator circuitry 30. Also, DAC1 (which is configured to output the control signal B1 to control the candidate current source CCS1) could be comprised within the comparator circuitry 30. Further, if each candidate current source is a transistor controlled by a DAC, then all of those DACs could be comprised within the comparator circuitry 30. Similarly, DACs for controlling the signals GV and B-MSB and B-LSB4 to B-LSB0 could be comprised within the comparator circuitry 30.

The two inputs R1 and R2 are connected to node 31, which may be considered a test node. The test node 31 is connected to one of the input terminals of the comparator 36 and the nodes 33 and 35, and the other input terminal of the comparator 36 is connected to nodes 37 and 39 and a voltage source (not shown) to maintain that node at a target voltage level (Vcm). The capacitor 32 and the switch 34 are connected in parallel with one another between the two input terminals of the comparator 36, with the capacitor 32 connected between nodes 33 and 37, and the switch 34 connected between nodes 35 and 39.

In operation of the comparator circuitry 30, the switch 34 is turned on or closed (for example by the control unit 38 or other control circuitry not shown) which connects the node 35, and therefore the node 31, to the node 39 which is held at the target voltage level (Vcm). Thus, the capacitor 32 is discharged and the test node 31 is biased to the target voltage level (Vcm). The switch 34 is then turned off or opened (for example by the control unit 38 or other control circuitry not shown) and the difference between the currents at R1 and R2 (connected at the node 31) will start integrating over (i.e. charging—positively or negatively) the capacitor 32.

Depending on the difference between the currents at R1 and R2, a voltage at the node 31 will move up or down. After a given test period (a time period chosen to be suitable for the capacitor 32 to be charged to a sufficient extent), the output of the comparator 36 will be high or low depending on the difference between the currents at R1 and R2 (which leads to a difference between the voltages at its two inputs). The comparator 36 thus outputs control signal R3 (which is either high or low depending on the difference between the currents at R1 and R2) to the control unit 38. The control unit 38 is configured to receive the control signal R3 and to output a digital control signal R4 for causing DAC1 to adjust its control signal B1. DAC1 receives the control signal R4 and accordingly controls/adjusts its control signal B1 applied to the candidate current source CCS1 to control/adjust the candidate current CC1.

This process may be iterated, for example in a successive approximation way (e.g. binary search). The process may be iterated until the output of the comparator 36 (the control signal R3) changes state (i.e. changes from low to high or vice versa) with one 1LSB change in DAC1. At that point, the currents at R1 and R2 are deemed to be calibrated to be in a defined relationship with each other (for example equal) to within the required accuracy. For example, the difference between the currents is then less than a threshold current difference. In the FIG. 10 example, the candidate current source CCS1 is calibrated such that its candidate current CC1 is equal to the calibration current Ic (within the required resolution set by the LSB of the DAC1).

The test period (the length of time that the capacitor allowed to charge) can be increased or decreased depending on the desired accuracy/resolution vs speed of operation of the comparator circuitry 30. For example if the control signal R3 is output and used for controlling/adjusting a candidate current after a very short test period so that the capacitor 32 is charged for a very short time then the difference between the currents at R1 and R2 will be detected with a relatively low accuracy. If the control signal R3 is output and used for controlling/adjusting a candidate current after a longer test period so that the capacitor 32 is charged for a longer time then the difference between the currents at R1 and R2 will be detected with higher accuracy, but the calibration process will take longer.

The comparator circuitry 30 may operate in a similar way when other currents are compared in line with the table of FIG. 8, with the relevant currents being applied at nodes R1 and R2 as indicated and with the control signal R4 (or an equivalent control signal) then being used to control a DAC which in turn controls the relevant control signal of the signals B1 to B4, GV, B-MSB (per MSB segment), B-LSB4 (per LSB4 segment), B-LSB3 (per LSB3 segment), B-LSB2 (per LSB2 segment), B-LSB1 (per LSB1 segment) and B-LSB0 (per LSB0 segment).

For example, at time step t3, one of the output current sources 301 to 306 is to be controlled or adjusted, in particular output current source 302 being one of the segments of segment group LSB4. In this case, the candidate current source CCS1 is connected to draw candidate current CC1 from node 31 at input R1 (as conveniently shown in FIG. 10) and the output current source 302 (implemented with field-effect transistors in its current mirror in line with FIG. 3B, i.e. PMOS MOSFETs) is connected to supply output current I4 to node 31 at input R2. The control signal R4 (or an equivalent control signal) is then used to control a DAC which in turn controls the relevant control signal B-LSB4 (which adjusts a bulk voltage of at least one of the field-effect transistors of the current mirror of the output current source 302).

As another example, at time step t8, all of the candidate current sources CCS1 to CCS4 are to be controlled or adjusted, using the control signal GV. In this case, the candidate current sources CCS1 to CCS4 are connected to draw their candidate currents CC1 to CC4 together from node 31 at input R1 and the output current source 304 (implemented with field-effect transistors in its current mirror in line with FIG. 3B, i.e. PMOS MOSFETs) is connected to supply output current I2 to node 31 at input R2. The control signal R4 (or an equivalent control signal) may then be used to control a DAC which in turn controls the relevant control signal GV (which adjusts a gate voltage of all of the candidate current sources CCS1 to CCS4).

The particular voltage Vcm at which the node 39 is held in operation of the comparator circuitry 30 is in a particular implementation the common-mode voltage of e.g. the segmented DAC circuitry 100 or 101. Using this voltage as above uniformly to determine the difference between two currents will ensure that the accuracy of the calibrated current mirrors is optimised or is best at the common-mode voltage.

The same comparator circuitry 30 may be used for one or more steps of the methods disclosed herein as will be apparent. It will also be apparent that different instances of such comparator circuitry may be used for one or more steps of the methods disclosed herein, enabling some of the time steps t1 to t11 to occur in parallel (contemporaneously) for example.

FIG. 11 is a schematic diagram useful for exploring the benefits of the arrangements disclosed herein. FIG. 11 shows two current mirrors 50 and 60, implemented with field-effect transistors (here, PMOS MOSFETs) either of which could be representative of a current mirror of a segment (i.e. an output current source), and as such its input current is shown as being the segment current Is for ease of understanding.

Current mirror 50 is represented by an input transistor 52 (carrying the segment current Is) and an output transistor 54 (generating an output current $I_{54}$). Current mirror 60 is represented by an input transistor 62 (carrying the segment current Is) and an output transistor 64 (generating an output current $I_{64}$). Although each represented as a single transistor, the input transistor 52 and the output transistors 54 and 64 may each be implemented as a plurality of parallel-connected transistors (devices). The input transistor 62 may in general also be implemented as a plurality of parallel-connected transistors but is shown here as implemented as a single device.

The current mirror 50 is configured to be controlled by a DAC 56 and the current mirror 60 is configured to be controlled by a DAC 66. DACs 56 and 66 again are sub-DACs of the overall current-generation circuitry 300 (implementing the DAC circuitry 101). In particular, the DAC 56 is configured to control the bulk voltage of at least one device (MOSFET) which makes up the transistor 54. Similarly, the DAC 66 is configured to control the bulk voltage of at least one device (MOSFET) which makes up the transistor 64. This control corresponds to the control using the relevant ones of the signals B-MSB and B-LSB4 to B-LSB0 as described above.

The parameters of the transistors (or set of transistors) are shown next to each side of each current mirror. That is, the channel width is shown by W, the channel length is shown by l, the number of fingers is shown by nf and the number of devices (transistors) is shown by m.

The current mirror 50 represents one way of constructing a current mirror having a desired current mirror ratio. That is, for each side of the current mirror (i.e. for each transistor or set of transistors 52 and 54), the parameters W, l and nf are kept the same, but the number of devices, m, is changed according to the desired current mirror ratio. In other words, a current mirror having a current mirror ratio of m1:m2 (input:output) can be built by having m1 identical devices (transistors) on the input side 52 and having m2 identical devices (transistors) on the output side 54. The devices on one side are identical to the devices on the other side to ensure good accuracy of the current mirror 50, and ease of design/layout. In this case, the output current $I_{54}$=Is*(m2/m1). Thus, if for example m1=512 and m2=1, the output current $I_{54}$=Is*(1/512) and the current mirror 50 would be suitable for the segments of the LBS0 segment group in FIG. 4.

Although the configuration of the current mirror 50 may be desirable (since all of the devices are identical) in implementations where the desired current mirror ratio is relatively low with ease of design and accuracy in mind, it will be appreciated that for current mirrors with relatively large ratios (e.g. 128:1 for LSB1 or 512:1 for LSB0 in FIG. 4) a large number of devices will be needed. This leads to area implications as well as speed implications due to the large parasitic capacitance associated with the large number of devices (transistors). To try to overcome these implications using smaller devices leads to accuracy implications.

To build current mirrors having a relatively large ratio, a relatively small number of devices may be used if there is more flexibility on the device parameters, e.g. W, l and nf as well as m. However, by varying such device parameters in order to generate the desired current mirror ratio, this is the risk of relatively low accuracy in the mirror ratio. However, such a current mirror may be adjusted (calibrated) by adjusting or controlling a control signal applied to the current mirror by a DAC, for example by adjusting the relevant one of the signals B-MSB and B-LSB4 to B-LSB0 as described above with reference to FIG. 8. This mitigates the above-mentioned problems in relation to speed, parasitic capacitance and accuracy.

For example in the current mirror 60 there are m=k devices on the output side and m=1 device on the input side. The properties W, l and nf of the devices on the output side are not necessarily the same as the properties W, l and nf of the device on the input side. It may be that the properties of each device on the output side 64 are the same or even not the same as those of each other device on the output side 64.

In some arrangements, transistor 64 has the same W,L for each of its fingers (nf) or devices (m). However, in such arrangements, for all of the fingers and devices, W and L are different for transistor 64 when compared to transistor 62. Bulk calibration may be same for each device 64 (nf, m). If every finger (nf) and device (m) has a different W,l, then the bulk voltage value translates to a non-linear gain for transistor 64 and therefore limits the range of the calibration.

The parameters W, l and nf of the devices on the output side 64 are chosen to generate the desired current mirror ratio—in this example case 512:1. The DAC 66 is configured to output a control signal to the output side 64 of the current mirror 60. This control signal may be applied to one, some or all of the devices (transistors) of the output side, to control its bulk voltage. Compared to the above, this allows to change a factor kgain but keep linearity of this gain. More than one bulk voltage on the output side 64 may be controlled, with the relevant control signal configured accordingly (e.g. using another DAC). Of course, at least one bulk voltage on the input side 62 may also be controlled via another DAC to help generate the desired current mirror ratio.

This technique for building a current mirror with a relatively high current mirror ratio (e.g. higher than 32:1) results in a smaller area needed for the mirror (fewer devices are required, and small devices can be used), improved speed of the current mirror (due to less parasitic capacitance since there are fewer and smaller devices) and improved reliability (since calibration—e.g. using the DAC 66—can account for any mismatch between the devices, which may be present even between devices which are supposedly identical). Thermal/flicker noise can also be reduced by reducing the W/l ratio of the devices employed. Typically, flicker noise is proportional to current and inversely proportional to l. Thermal noise is proportional to gm and thus W/l.

As an example, a current mirror with a current mirror ratio of 1024:1 can be built in line with the current mirror 60 of FIG. 11 using one device (or two or a few devices) on the input side of the current mirror and fewer than 15 or 20 or 25 devices on the output side of the current mirror, using non-uniform parameters in relation to at least one of W, l and nf between the sides of the current mirror, along with bulk-voltage control to calibrate the ratio in line with the methodology described above with reference to FIG. 8 (i.e. the calibration of candidate current sources and then the calibration of successive output current sources, one of the output current sources comprising the desired 1024:1 current mirrors). The candidate current sources are calibrated to be accurate and then adjusted in the successive steps C each time reducing their currents by the example factor of 4 until their currents are suitable (i.e. small enough) to calibrate a current mirror with a 512:1 mirror ratio in time step t11 (with further method steps C and D,E in time steps t12 and t13, although not shown in FIG. 8, being suitable to lead to currents suitable to calibrate a current mirror with a 1024:1 mirror ratio in time step t13).

The DACs (sub-DACs of the overall current-generation circuitry 300 implementing the DAC circuitry 101) are configured to adjust the current mirrors by "trimming" the bulk voltage of one or more transistors of the current mirrors. The DACs used for this may be relatively simple DACs (requiring a small area and low power consumption). For example, the DACs may be 8-bit DACs with less than 300 mV of range (e.g. 0.7V±150 mV). For context, an example implementation of the FIG. 4 circuitry, using differential outputs in line with FIG. 2, may for example have a constant 10 mA output split between the Ip and In outputs depending on the binary input word (digital input signal). As to accuracy, a current mirror with a current mirror ratio of 1:2 (see e.g. FIG. 4) could require for example an accuracy such that errors are within 0.005% of a target value.

Figure 1:
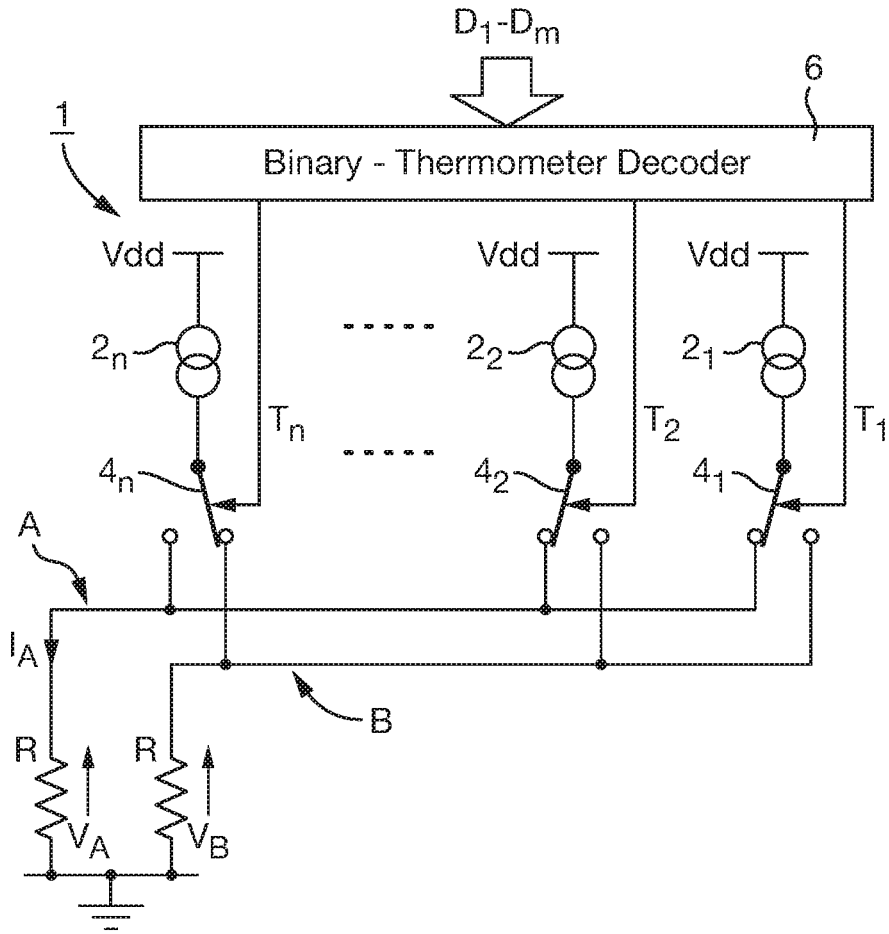
Figure 12:
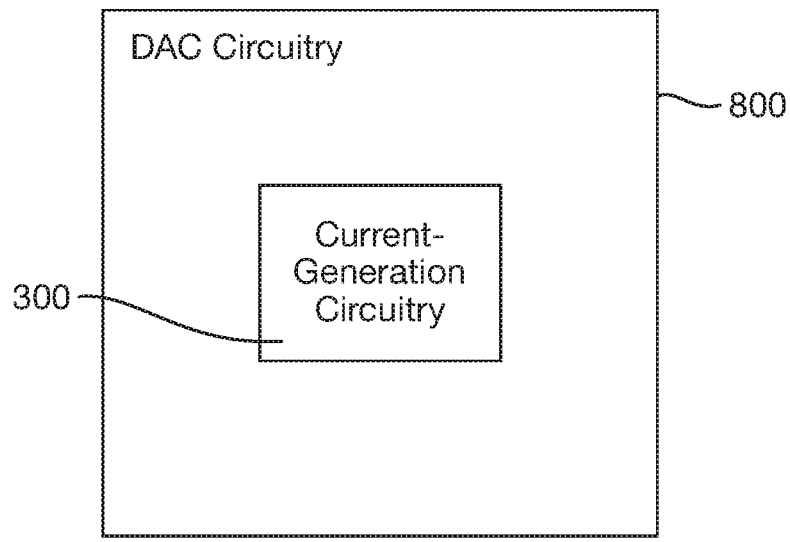
FIG. 12 is a schematic diagram of DAC circuitry comprising the current-generation circuitry and/or the calibration circuitry of FIG. 5.

FIG. 12 is a schematic diagram of DAC circuitry 800 comprising the current-generation circuitry 300 and/or the calibration circuitry 10 of FIG. 5. As explained in connection with FIGS. 4 and 5, the current-generation circuitry 300 including the output current sources 301 to 306 may be considered an implementation of the DAC circuitry 101 with the output current sources 301 to 306 representative of segments of such DAC circuitry (i.e. DAC slices).

Circuitry of the present invention may be implemented as integrated circuitry, for example on an IC chip such as a flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

Further embodiments may be provided within the spirit and scope of the present invention as disclosed herein.

The present disclosure extends to the following statements, which are useful for understanding the circuitry and associated methods disclosed herein:

S1. A method of generating currents in current-generation circuitry, the current-generation circuitry comprising a plurality of candidate current sources operable to generate respective candidate currents and an output current source operable to generate an output current, the method comprising:

in an adjustment step, generating an adjustment current by selecting one of the candidate currents or by summing together a plurality of the candidate currents, and calibrating at least a plurality of the candidate current sources including each candidate current source which contributes to that adjustment current by comparing that adjustment current to a comparative current and adjusting control signals applied to the candidate current sources being calibrated to adjust their candidate currents until that adjustment current and the comparative current are brought into a defined relationship; and in a calibration step, following the adjustment step, generating a reference current by selecting one of the candidate currents generated by the candidate current sources calibrated in the adjustment step or by summing together a plurality of the candidate currents generated by those candidate current sources, and calibrating the output current source by comparing its output current to that reference current and adjusting a control signal applied to that output current source to adjust its output current until its output current and that reference current are brought into a defined relationship.

S2. The method according to statement S1, wherein:
the adjustment step comprises summing together a plurality of the candidate currents, and calibrating at least the candidate current sources which generate that adjustment current by comparing that adjustment current to the comparative current and adjusting the control signals applied to the candidate current sources being calibrated to reduce their candidate currents until that adjustment current and the comparative current are brought into the defined relationship; and/or
the comparative current is smaller than the adjustment current, and optionally substantially equal to the candidate current of one of the candidate current sources calibrated in the adjustment step prior to that calibration.

S3. The method according to statement S1 or S2, wherein:
the candidate current sources each comprise a field-effect transistor, and the control signals adjusted in the adjustment step are gate voltages of the transistors concerned, optionally wherein:
the transistors concerned are provided with a common gate voltage; and/or
the adjustment of the control signals in the adjustment step is carried out while maintaining the bulk voltages of the transistors concerned.

S4. The method according to any of the preceding statements, wherein the control signals adjusted in the adjustment step are adjusted together to adjust the candidate currents concerned together.

S5. The method according to any of the preceding statements, wherein:
the output current source comprises a field-effect transistor, and wherein the control signal adjusted in the calibration step is a bulk voltage of the transistor concerned.

S6. The method according to any of the preceding statements, wherein:
in the adjustment step the control signals applied to the candidate current sources being calibrated are adjusted to reduce their candidate currents until that adjustment current and the comparative current are brought into the defined relationship;
in the adjustment step the number of candidate currents summed together to generate the adjustment current is a large number; and
in the calibration step the number of candidate currents comprised by the reference current is a small number in that it is smaller than said large number.

S7. The method according to any of the preceding statements, wherein in the adjustment step the control signals applied to the candidate current sources being calibrated are adjusted to reduce their candidate currents until that adjustment current and the comparative current are brought into the defined relationship, and wherein the current-generation circuitry comprises a plurality of said output current sources operable to generate respective output currents, the method comprising:
following the adjustment step and the calibration step, successively performing a further said adjustment step followed by a further said calibration step,
wherein:
in each further adjustment step, the adjustment current is generated by summing together a plurality of the candidate currents generated by the candidate current sources calibrated in the preceding calibration step; and
in each further calibration step, the output current source which is calibrated is another one of the output current sources from the one of the output current sources calibrated in the preceding calibration step.

S8. The method according to statement S7, wherein in each further adjustment step, the comparative current is the output current as adjusted in the preceding calibration step.

S9. The method according to statement S7 or S8, wherein:
in each further adjustment step the number of candidate currents summed together to generate the adjustment current is a large number in that it is larger than the number of candidate currents comprised by the reference current of the preceding calibration step; and
in each further calibration step the number of candidate currents comprised by the reference current is a small number in that it is smaller than the number of candidate currents summed together to generate the adjustment current of the preceding adjustment step.

S10. The method according to statement S9, wherein:
said large numbers are the same as one another; and/or
said small numbers are the same as one another; and/or
the number of candidate current sources in the plurality of candidate current sources is equal to a said large number or the largest of said large numbers.

S11. The method according to any of the preceding statements, wherein the current-generation circuitry comprises a plurality of said output current sources operable to generate respective output currents, the method comprising:
in an initial step, preceding said adjustment step, generating a reference current by selecting one of the candidate currents generated by the candidate current sources or by summing together a plurality of the candidate currents generated by the candidate current sources, and calibrating another one of the output current sources by comparing its output current to that reference current and adjusting a control signal applied to that output current source to adjust its output current until its output current and that reference current are brought into a defined relationship.

S12. The method according to statement S11, wherein said reference current generated in the initial step is a small reference current, the method comprising:
in the initial step, generating a large reference current by summing together a plurality of the candidate currents generated by the candidate current sources such that the large reference current is larger than the small reference current, and calibrating another one of the output current sources by comparing its output current to that large reference current and adjusting a control signal applied to that output current source to adjust its output current until its output current and that large reference current are brought into a defined relationship.

S13. The method according to any of the preceding statements, comprising:
in a candidate-setup step, optionally before another said step is performed, calibrating each of said candidate current sources by, for each of those candidate current sources, comparing its candidate current to a calibration current and controlling a control signal applied to that candidate current source until those currents are brought into a defined relationship.

S14. The method according to statement S13, wherein:
the candidate current sources each comprise a field-effect transistor, and wherein the control signals adjusted in the candidate-setup step are bulk voltages of the transistors concerned,
optionally wherein the adjustment of the control signals in the candidate-setup step is carried out while maintaining the gate voltages of the transistors concerned.

S15. A method of generating currents in current-generation circuitry, the current-generation circuitry having a plurality of candidate current sources operable to generate respective candidate currents and a plurality of output current sources operable to generate respective output currents, the method comprising:

generating a plurality of different reference currents by, for each of those reference currents, selecting one of the candidate currents or summing together a plurality of the candidate currents; and for each of at least a plurality of the reference currents, calibrating a corresponding one of the output current sources by comparing its output current to the reference current concerned and adjusting a control signal applied to that output current source to adjust its output current until those currents are brought into a defined relationship.

S16. The method according to statement S15, wherein the method comprises:

before generating said reference currents, calibrating each of the candidate current sources by, for each of the candidate current sources, comparing its candidate current to a calibration current and controlling a control signal applied to that candidate current source until those currents are brought into a defined relationship.

S17. The method according to statement S15 or S16, wherein the candidate current sources are calibrated using the same calibration current.

S18. The method according to any of the preceding statements, wherein:

in one or more or each of said defined relationships, the currents concerned are substantially equal in magnitude to one another; and/or the candidate currents are substantially equal in magnitude to one another.

S19. The method according to any of the preceding statements, wherein summing together candidate currents comprises connecting together respective current paths carrying those candidate currents.

S20. The method according to any of the preceding statements, wherein each output current source comprises a current mirror comprising field-effect transistors and wherein adjusting a said control signal applied to a said output current source comprises adjusting a bulk voltage of one more field-effect transistors of the current mirror.

S21. The method according to statement S20, wherein:

each output current source comprises a switchable current source, operable to provide an input current to the current mirror of that output current source in dependence upon a digital input signal;

for each output current source, the current mirror is operable to provide the output current based on the input current; and the current-generation circuitry is configured to combine the output currents from the output current sources to generate an overall output current dependent on the digital input signal.

S22. The method according to statement S21, wherein:

the output current sources are configured such that their input currents have an ON value or an OFF value in dependence upon the digital input signal, the ON values being the same for the output current sources and the OFF values being the same for the output current sources.

S23. The method according to any of statements S20 to S22, wherein for at least one said current mirror at least one of the channel width, channel length and number of fingers of one or more field-effect transistors which carry an input current of that current mirror is different from that of one or more field-effect transistors which carry an output current of that current mirror.

S24. The method according to any of the preceding statements, wherein the comparing of currents comprises:

connecting current paths carrying the currents to be compared to a test node such that one of the currents to be compared is input to the test node and the other of the currents to be compared is drawn from the test node;

connecting the test node to a target voltage source so as to bias a test voltage at the test node at a target voltage level; and after biasing the test voltage at the target voltage level, disconnecting the test node from the voltage source and monitoring the test voltage.

S25. The method according to statement S24, comprising, for each comparing of currents:

adjusting the control signal or control signals concerned and repeating the comparing until after biasing the test voltage at the target voltage level and disconnecting the test node from the voltage source the test voltage does not change from the target voltage level beyond a threshold amount or until the test voltage drifts from the target voltage level in opposite directions for adjacent values of the control signal or control signals concerned.

S26. A method of generating currents in current-generation circuitry, the current-generation circuitry having a plurality of candidate current sources operable to generate respective candidate currents, wherein the candidate current sources are implemented as field-effect transistors, the method comprising:

calibrating each of the candidate current sources by, for each of the candidate current sources, comparing its candidate current to a calibration current and controlling a control signal applied to that candidate current source to control its bulk voltage until those currents are brought into a defined relationship; and after calibrating each of the candidate current sources, connecting a first number of the candidate current sources in parallel and diode-connecting them to form the input side of a current mirror, connecting a second number of the candidate current sources in parallel to form the output side of a current mirror, wherein the gate terminals of the candidate current sources are connected together and the source terminals of the candidate current sources are connected together.

S27. A method of generating currents in current-generation circuitry, the current-generation circuitry comprising a plurality of candidate current sources operable to generate respective candidate currents, the method comprising:

generating an adjustment current by summing together a large number of the candidate currents, wherein the large number is greater than or equal to two;

calibrating at least the candidate current sources which generate that adjustment current by comparing that adjustment current to a comparative current and adjusting control signals applied to those candidate current sources together to reduce their candidate currents together until that adjustment current and the comparative current are brought into a defined relationship; and generating a reference current by summing together a small number of the candidate currents generated by those candidate current sources.

S28. A method of generating currents in current-generation circuitry, the current-generation circuitry having a plurality of candidate current sources operable to generate respective candidate currents and a plurality of output current sources operable to generate respective output currents, the method comprising:
  in a step A, generating a reference current by summing together a small number of the candidate currents, wherein the small number is greater than or equal to one;
  in a step B, following step A, calibrating one of the output current sources by comparing its output current to the reference current generated in step A and adjusting a control signal applied to that output current source to adjust its output current until those currents are brought into a defined relationship;
  in a step C, following step B as a preceding step or following a preceding step E, generating an adjustment current by summing together a large number of the candidate currents, wherein that large number is larger than the small number used in generating the reference current of the preceding step, and calibrating at least the candidate current sources which generate that adjustment current by comparing that adjustment current to the output current of the output current source adjusted in step B (or in the preceding step) and adjusting the control signals applied to those candidate current sources together to reduce their candidate currents together until that adjustment current and the output current of the output current source adjusted in step B (or in the preceding step) are brought into a defined relationship; and
  in a step D, following the preceding step C, generating a reference current by summing together a new small number of the candidate currents generated by candidate current sources calibrated in the preceding step C, wherein the new small number is greater than or equal to one and less than the large number of the preceding step C; and
  in a step E, following the preceding step D, calibrating a further one of the output current sources by comparing its output current to the new small reference current of the preceding step D and adjusting a control signal applied to that further output current source until those currents are brought into a defined relationship.

S29. A method of generating currents in current-generation circuitry, the current-generation circuitry having a plurality of candidate current sources operable to generate respective candidate currents and a plurality of output current sources operable to generate respective output currents, the method comprising:
  calibrating each of the candidate current sources by, for each of the candidate current sources, comparing its candidate current to a reference current and controlling a control signal applied to that candidate current source until those currents are brought into a defined relationship;
  after calibrating the candidate current sources, generating a plurality of reference currents by, for each of those reference currents, summing together one or more of the candidate currents; and
  for at least a plurality of the reference currents, calibrating a corresponding one of the output current sources by comparing its output current to the reference current concerned and adjusting a control signal applied to that output current source to adjust its output current until those currents are brought into a defined relationship.

S30. Current-generation circuitry configured to carry out the method of any of the preceding statements.

S31. Current-generation circuitry according to statement S30, comprising:
  the current sources;
  comparator circuitry configured to carry out the comparing; and
  control circuitry operable to control the current sources and the comparator circuitry to implement the method.

S32. A digital-to-analogue converter comprising the current-generation circuitry of statement S30 or S31.

S33. Integrated circuitry such as an IC chip comprising the current-generating circuitry of statement S30 or S31 or the digital-to-analogue converter of statement S32.

S34. Current-generation circuitry, comprising:
  a plurality of output current sources operable to generate respective output currents, each output current source comprising a current mirror configured to output the output current concerned based on a corresponding input current;
  reference circuitry operable to generate at least one reference current; and
  control circuitry operable to calibrate the current mirror of at least one of the output current sources by comparing its output current to a said reference current and controlling a control signal applied to that current mirror to adjust its output current until its output current and that reference current are brought into a defined relationship.

The invention claimed is:

1. Current-generation circuitry, comprising:
  a plurality of candidate current sources operable to generate respective candidate currents;
  an output current source operable to generate an output current;
  comparator circuitry; and
  control circuitry operable to control the current sources and the comparator circuitry and connections therebetween to:
    in an adjustment step, generate an adjustment current by selecting one of the candidate currents or by summing together a plurality of the candidate currents, and calibrate at least a plurality of the candidate current sources including each candidate current source which contributes to that adjustment current by comparing that adjustment current to a comparative current using the comparator circuitry and adjusting control signals applied to the candidate current sources being calibrated to adjust their candidate currents until that adjustment current and the comparative current are brought into a defined relationship; and
    in a calibration step, following the adjustment step, generate a reference current by selecting one of the candidate currents generated by the candidate current sources calibrated in the adjustment step or by summing together a plurality of the candidate currents generated by those candidate current sources, and calibrate the output current source by comparing its output current to that reference current and adjusting a control signal applied to that output current source to adjust its output current until its output current and that reference current are brought into a defined relationship.

2. The current-generation circuitry as claimed in claim 1, wherein:
  the adjustment step comprises summing together a plurality of the candidate currents, and calibrating at least the candidate current sources which generate that adjustment current by comparing that adjustment current to the comparative current and adjusting the control signals applied to the candidate current sources being calibrated to reduce their candidate currents until that adjustment current and the comparative current are brought into the defined relationship; or the comparative current is smaller than the adjustment current, and optionally substantially equal to the candidate current of one of the candidate current sources calibrated in the adjustment step prior to that calibration.

3. The current-generation circuitry as claimed in claim 1, wherein:
the candidate current sources each comprise a field-effect transistor, and the control signals adjusted in the adjustment step are gate voltages of the transistors concerned,
optionally wherein:
the transistors concerned are provided with a common gate voltage; or
the adjustment of the control signals in the adjustment step is carried out while maintaining the bulk voltages of the transistors concerned.

4. The current-generation circuitry as claimed in claim 1, wherein the control signals adjusted in the adjustment step are adjusted together to adjust the candidate currents concerned together.

5. The current-generation circuitry as claimed in claim 1, wherein:
in the adjustment step the control signals applied to the candidate current sources being calibrated are adjusted to reduce their candidate currents until that adjustment current and the comparative current are brought into the defined relationship;
the current-generation circuitry comprises a plurality of said output current sources operable to generate respective output currents;
the control circuitry is operable, following the adjustment step and the calibration step, to successively perform a further said adjustment step followed by a further said calibration step;
in each further adjustment step, the adjustment current is generated by summing together a plurality of the candidate currents generated by the candidate current sources calibrated in the preceding calibration step; and
in each further calibration step, the output current source which is calibrated is another one of the output current sources from the one of the output current sources calibrated in the preceding calibration step,
optionally wherein in each further adjustment step, the comparative current is the output current as adjusted in the preceding calibration step.

6. The current-generation circuitry as claimed in claim 1, wherein:
the current-generation circuitry comprises a plurality of said output current sources operable to generate respective output currents; and
the control circuitry is operable, in an initial step, preceding said adjustment step, to generate a reference current by selecting one of the candidate currents generated by the candidate current sources or by summing together a plurality of the candidate currents generated by the candidate current sources, and to calibrate another one of the output current sources by comparing its output current to that reference current using the comparator circuitry and adjusting a control signal applied to that output current source to adjust its output current until its output current and that reference current are brought into a defined relationship.

7. The current-generation circuitry as claimed in claim 6, wherein:
said reference current generated in the initial step is a small reference current; and
the control circuitry is operable, in the initial step, to generate a large reference current by summing together a plurality of the candidate currents generated by the candidate current sources such that the large reference current is larger than the small reference current, and to calibrate another one of the output current sources by comparing its output current to that large reference current using the comparator circuitry and adjusting a control signal applied to that output current source to adjust its output current until its output current and that large reference current are brought into a defined relationship.

8. The current-generation circuitry as claimed in claim 1, wherein the control circuitry is operable:
in a candidate-setup step, optionally before another said step is performed, to calibrate each of said candidate current sources by, for each of those candidate current sources, comparing its candidate current to a calibration current using the comparator circuitry and controlling a control signal applied to that candidate current source until those currents are brought into a defined relationship,
optionally wherein:
the candidate current sources each comprise a field-effect transistor, and wherein the control signals adjusted in the candidate-setup step are bulk voltages of the transistors concerned; and
the adjustment of the control signals in the candidate-setup step is carried out while maintaining the gate voltages of the transistors concerned.

9. A digital-to-analogue converter comprising the current-generation circuitry of claim 1.

10. Integrated circuitry such as an IC chip comprising the current-generating circuitry of claim 1.

11. The integrated circuitry of claim 10, wherein the integrated circuitry comprises an IC chip.

12. Integrated circuitry comprising a digital-to-analog converter comprising the current generating circuitry of claim 1.

13. The current-generation circuitry in claim 1, wherein:
In one or more or each of said defined relationships, the currents concerned are substantially equal in magnitude to one another.

14. The current-generation circuitry as claimed in claim 1, wherein each output current source comprises a current mirror comprising field-effect transistors and wherein adjusting said control signal applied to said output current source comprises adjusting a bulk voltage of one more field-effect transistors of the current mirror,
optionally wherein for at least one said current mirror at least one of the channel width, channel length and number of fingers of one or more field-effect transistors which carry an input current of that current mirror is different from that one or more field-effect transistors which carry an output current of that current mirror.

15. The current-generation circuitry as claimed in claim 1, wherein the comparing of currents comprises:
connecting current paths carrying the currents to be compared to a test node such that one of the currents to be compared is input to the test node and the other of the currents to be compared is drawn from the test node;

connecting the test node to a target voltage source so as to bias a test voltage at the test node at a target voltage level; and after biasing the test voltage at the target voltage level, disconnecting the test node from the voltage source and monitoring the test voltage.

16. Current-generation circuitry, comprising:

a plurality of candidate current sources operable to generate respective candidate currents;

a plurality of output current sources operable to generate respective output currents;

comparator circuitry; and control circuitry operable to control the current sources and the comparator circuitry and connections therebetween to:

generate a plurality of different reference currents by, for each of those reference currents, selecting one of the candidate currents or summing together a plurality of the candidate currents; and for each of at least a plurality of the reference currents, calibrate a corresponding one of the output current sources by comparing its output current to the reference current concerned using the comparator circuitry and adjusting a control signal applied to that output current source to adjust its output current until those currents are brought into a defined relationship.

17. The current-generation circuitry as claimed in claim 16, wherein the control circuitry is operable:

before generating said reference currents, to calibrate each of the candidate current sources by, for each of the candidate current sources, comparing its candidate current to a calibration current using the comparator circuitry and controlling a control signal applied to that candidate current source until those currents are brought into a defined relationship.

18. The current-generation circuitry as claimed in claim 16, wherein:

in one or more or each of said defined relationships, the currents concerned are substantially equal in magnitude to one another; or the candidate currents are substantially equal in magnitude to one another.

19. The current-generation circuitry as claimed in claim 16, wherein each output current source comprises a current mirror comprising field-effect transistors and wherein adjusting a said control signal applied to a said output current source comprises adjusting a bulk voltage of one or more field-effect transistors of the current mirror, optionally wherein for at least one said current mirror at least one of the channel width, channel length and number of fingers of one or more field-effect transistors which carry an input current of that current mirror is different from that of one or more field-effect transistors which carry an output current of that current mirror.

20. The current-generation circuitry as claimed in claim 16, wherein the comparing of currents comprises:

connecting current paths carrying the currents to be compared to a test node such that one of the currents to be compared is input to the test node and the other of the currents to be compared is drawn from the test node;

connecting the test node to a target voltage source so as to bias a test voltage at the test node at a target voltage level; and after biasing the test voltage at the target voltage level, disconnecting the test node from the voltage source and monitoring the test voltage.

* * * * *